(12) United States Patent
Shiba et al.

(10) Patent No.: US 7,466,599 B2
(45) Date of Patent: Dec. 16, 2008

(54) SEMICONDUCTOR DEVICE

(75) Inventors: Kazuyoshi Shiba, Hitachinaka (JP);
Yasuhiro Taniguchi, Ome (JP); Yasushi Oka, Tachikawa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/925,106

(22) Filed: Oct. 26, 2007

(65) Prior Publication Data

US 2008/0056011 A1 Mar. 6, 2008

Related U.S. Application Data

(63) Continuation of application No. 11/206,968, filed on Aug. 19, 2005, now Pat. No. 7,313,026.

(30) Foreign Application Priority Data

Sep. 9, 2004 (JP) ............................. 2004-261751

(51) Int. Cl.
*G11C 16/04* (2006.01)
(52) U.S. Cl. ...................... 365/185.28; 365/185.29; 365/185.14; 365/189.04
(58) Field of Classification Search ............ 365/185.28, 365/185.29, 185.14, 189.04
See application file for complete search history.

(56) References Cited

U.S. PATENT DOCUMENTS 5,457,335 A 10/1995 Kuroda et al.
5,610,854 A 3/1997 Ema
5,745,417 A * 4/1998 Kobayashi et al. ...... 365/185.29
6,788,574 B1 9/2004 Han et al.
6,972,997 B2 12/2005 Ishimaru et al.

FOREIGN PATENT DOCUMENTS

JP 2001-185638 7/2001
JP 2001-257324 9/2001
WO WO 03/096432 A1 11/2003

* cited by examiner

*Primary Examiner*—Thong Q Le
(74) *Attorney, Agent, or Firm*—Antonelli, Terry, Stout & Kraus, LLP.

(57) ABSTRACT

Provided is a nonvolatile memory with less element deterioration and good data retaining properties. In a nonvolatile memory formed by the manufacturing steps of a complementary type MISFET without adding thereto another additional step, erasing of data is carried out by applying 9V to an n type well, 9V to a p type semiconductor region, and −9V to another p type semiconductor region and setting the source and drain of data writing and erasing MISFETs and data reading MISFETs at open potential to emit electrons from a gate electrode to a p well by FN tunneling. At this time, by applying a negative voltage to the p well having a capacitive element formed thereover and applying a positive voltage to the p well having the MISFETs formed thereover, a potential difference necessary for data erasing operation can be secured at a voltage low enough not to cause gate breakage.

19 Claims, 22 Drawing Sheets

SEMICONDUCTOR DEVICE

CROSS-REFERENCE TO RELATED APPLICATION

This application is a continuation of U.S. application Ser. No. 11/206,968, filed Aug. 19, 2005 now U.S. Pat No. 7,313, 026, and, which application claims priority from Japanese patent application No. 2004-261751 filed on Sep. 9, 2004, the contents of which are hereby incorporated by reference into this application.

BACKGROUND OF THE INVENTION

The present invention relates to a semiconductor device and manufacturing technology thereof, in particular, to a technology effective when applied to a semiconductor device having a non-volatile memory such as electric erasable programmable read only memory (which will hereinafter be called "flash memory", simply).

In Japanese Unexamined Patent Publication No. 2001-185633 (Patent Document 1), disclosed is an EEPROM device fabricated on a single conductive layer formed on a semiconductor substrate, while being insulated via an insulation layer; wherein the EEPROM device is a single level poly EEPROM device whose area per bit can be reduced.

In Japanese Unexamined Patent Publication No. 2001-257324 (Patent Document 2), disclosed is a technology capable of improving a long-term data holding performance in a nonvolatile memory device formed by a single layer poly-flash technology.

[Patent Document 1] Japanese Unexamined Patent Publication No. 2001-185633

[Patent Document 2] Japanese Unexamined Patent Publication No. 2001-257324

SUMMARY OF THE INVENTION

The present inventors have investigated a technology of forming a nonvolatile memory by only the manufacturing steps of a complementary MISFET without adding another step thereto. During the investigation, they have found the problems as described below.

When a fuse circuit is formed using the above-described nonvolatile memory, data are erased electrically at a drain end by FN (Fowler-Nordheim) tunneling. This causes electric field concentration in the drain end and inevitably accelerates element deterioration.

When an OTPROM (One Time Programmable Read Only Memory) type fuse circuit is formed using a nonvolatile memory, a memory capacity corresponding to the rewriting frequency must be required because it does not practically carry out rewrite operation, and the module size inevitably becomes large. In addition, a manufacturing cost of the module inevitably increases with a rise in the memory capacity and an increase in the module size.

An object of the present invention is to provide a nonvolatile memory showing less element deterioration and good data retaining properties.

Another object of the present invention is to provide a technology capable of downsizing the module having a nonvolatile memory mounted therein.

The above-described and other objects and novel features of the present invention will be apparent from the description herein and accompanying drawings.

Of the inventions disclosed by the present application, typical ones will next be summarized.

In the present invention, there is thus provided a semiconductor device, equipped with a nonvolatile memory cell, which comprises:

a first conductivity type semiconductor isolation layer formed over a main surface of a semiconductor substrate;

a second conductivity type first well and a second conductivity type second well, each formed in the semiconductor isolation layer;

a first conductivity type third well formed in the semiconductor isolation layer and separating the first well and the second well;

a first gate electrode extending over the first well and the second well via a first gate insulating film; and a data writing MISFET and a data reading MISFET, each formed in the first well and using the first gate electrode as a gate electrode, wherein a first voltage in a forward direction is applied to the second well when writing of data to the nonvolatile memory cell is carried out, and wherein a first voltage in a reverse direction is applied to the second well when erasing of data from the nonvolatile memory cell is carried out.

Advantages available by the typical inventions, of the inventions disclosed by the present application, will next be described.

The present invention makes it possible to manufacture a nonvolatile memory showing less element deterioration and good data retaining properties.

The present invention also makes it possible to downsize a module having a nonvolatile memory mounted therein.

DETAILED DESCRIPTION OF THE PREFERRED EMBODIMENTS

Figure 1:
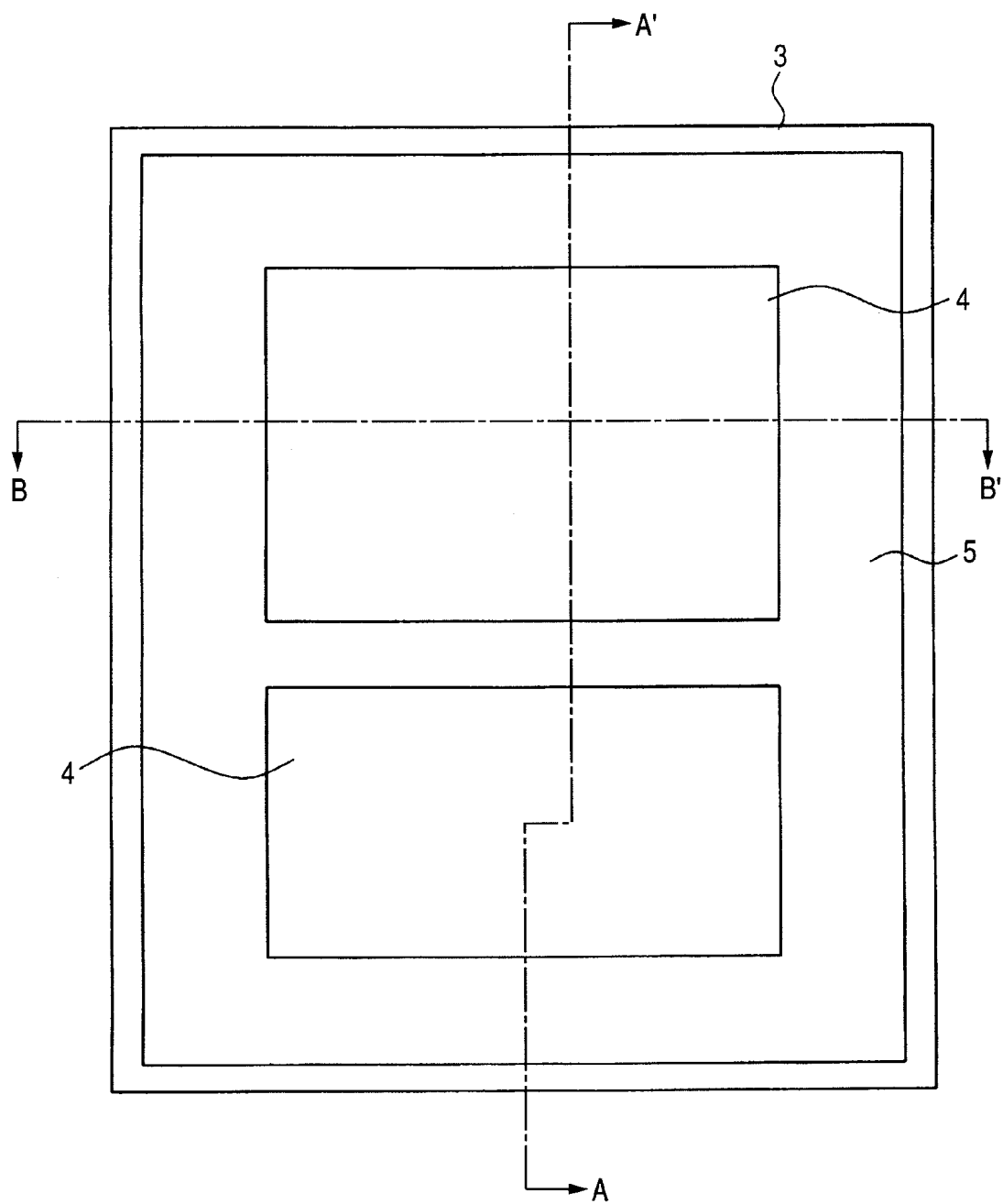
FIG. 1 is a fragmentary plan view illustrating a manufacturing method of a semiconductor device according to Embodiment 1 of the present invention.

Embodiments of the present invention will hereinafter be described in full detail based on accompanying drawings. In all the drawings for describing the below-described embodiments, elements having like function will be identified by like reference numerals and overlapping descriptions will be omitted.

Embodiment 1

The semiconductor device according to Embodiment 1 has a nonvolatile memory. The manufacturing steps of the semiconductor device of Embodiment 1 will next be described with reference to FIGS. 1 to 13.

FIGS. 1, 3, 6 and 11 are each a fragmentary plan view of a memory cell region of the semiconductor device of Embodiment 1 during its manufacturing step, while FIGS. 2, 4, 5, 7-10, 12 and 13 are each a fragmentary cross-sectional view illustrating the manufacturing step of the semiconductor device of Embodiment 1. In each cross-sectional view, a portion marked with A and A' is a cross-section taken along a line A-A' in the corresponding plan view; a portion marked with B and B' is a cross-section taken along a line B-B' in the corresponding plan view, and a portion marked with C and C' is a cross-section of a part (a region in which an n channel type MISFET (Metal Insulator Semiconductor Field Effect Transistor) is to be formed) of a peripheral circuit region. Each plan view includes only main conductive layers constituting the nonvolatile memory cell and connection regions of them and an insulating film formed between conductive layers is omitted in principle. An X decoder circuit, Y decoder circuit, sense amplifier circuit, input/output circuit, logic circuit and the like are formed using an n channel MISFET constituting the peripheral circuit. Not only these circuits but also logic circuits such as microprocessor and CPU may be formed.

Figure 2:
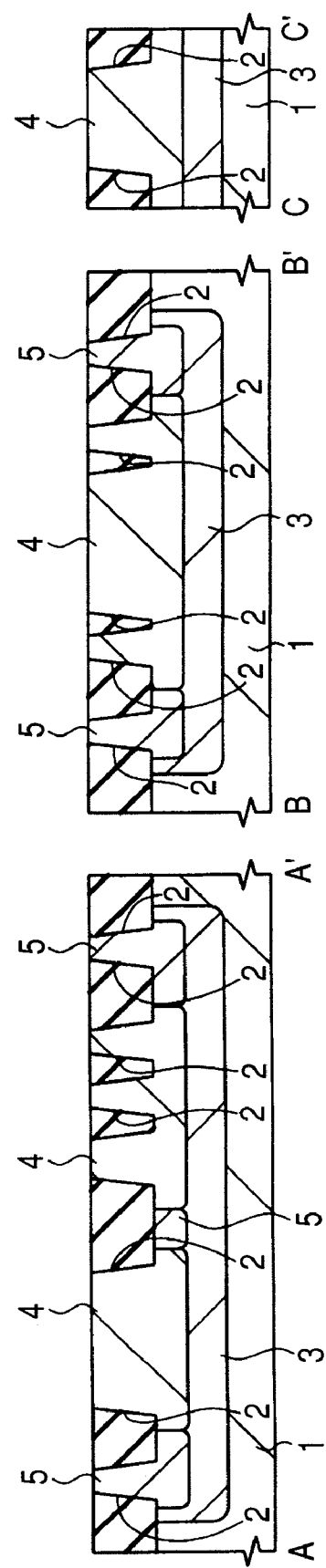
FIG. 2 is a fragmentary cross-sectional view illustrating a manufacturing method of the semiconductor device according to Embodiment 1 of the present invention.

As illustrated in FIGS. 1 and 2, an element isolation trench 2 is formed in an element isolation region on the main surface of a semiconductor substrate (which will hereinafter be called "substrate" simply) made of, for example, p type single crystal silicon. This element isolation trench 2 is formed, for example, by dry etching the main surface of the substrate 1 to form a trench, depositing an insulating film such as silicon oxide film over the substrate 1 including the inside of this trench by CVD (Chemical Vapor Deposition), and polishing and removing an unnecessary portion of the insulating film outside of the trench by chemical mechanical polishing (CMP) to leave the insulating film inside of the trench. By forming this element isolation trench 2, an active region having a periphery defined by the element isolation trench 2 is formed over the main surface of the semiconductor substrate 1 of the memory array.

After ion implantation of an n type (first conductivity type) impurity (for example, P (phosphorus) or As (arsenic)) into a part of the substrate 1, the resulting substrate 1 is heat treated to diffuse the impurity into the substrate 1, whereby an n type semiconductor separation region (semiconductor isolation layer) 3 is formed.

After implantation of an n type impurity (for example, P) into a part of the substrate 1 and implantation of a p type (second conductivity type) impurity (for example, B (boron)) into another part of the substrate, the resulting substrate 1 is heat treated to diffuse these impurities into the substrate 1, whereby p wells (first well, second well) 4 and n well (third well) 5 are formed over the main surface of the substrate 1.

Figure 3:
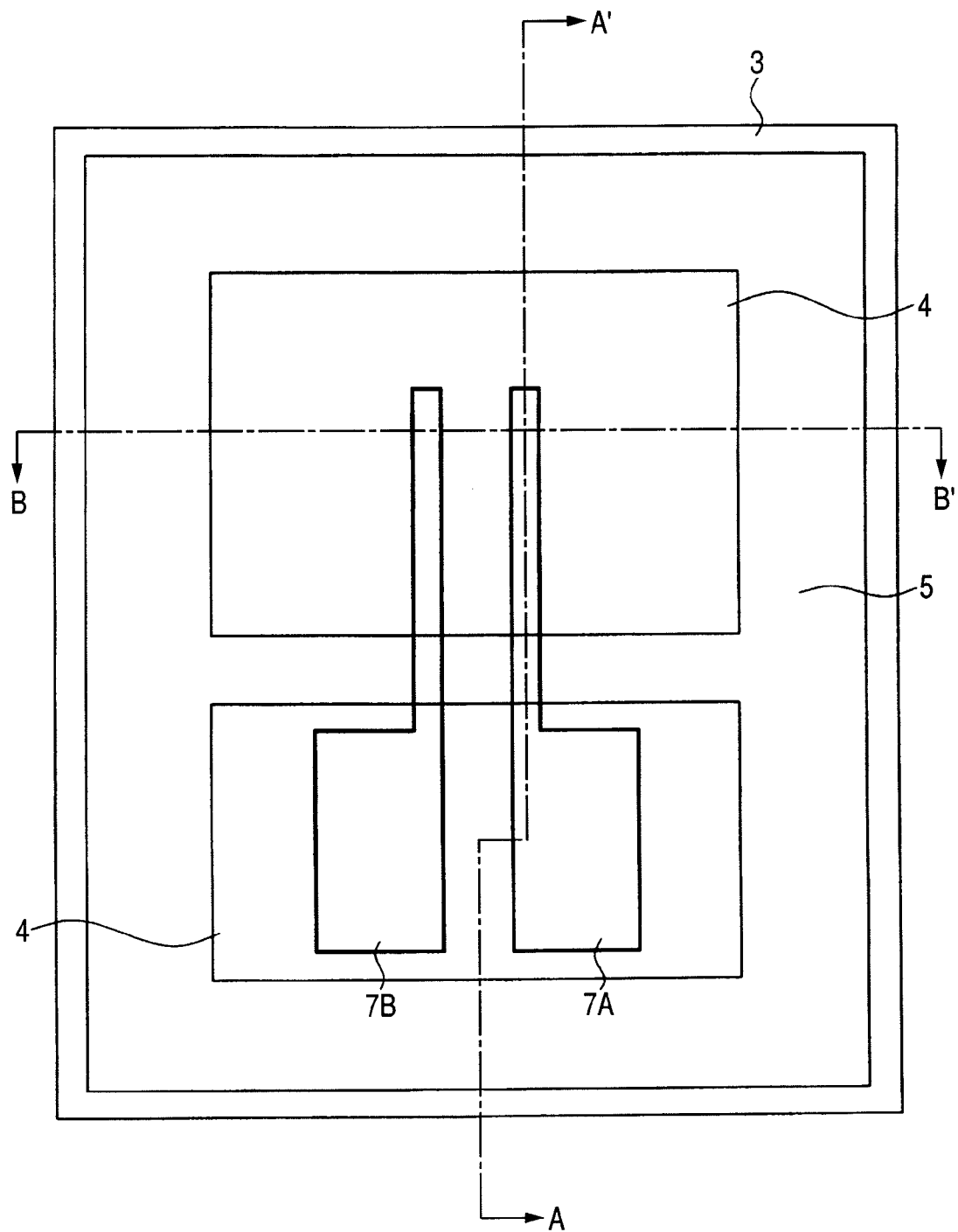
FIG. 3 is a fragmentary plan view of the semiconductor device during its manufacturing step following that of FIG. 1.
Figure 4:
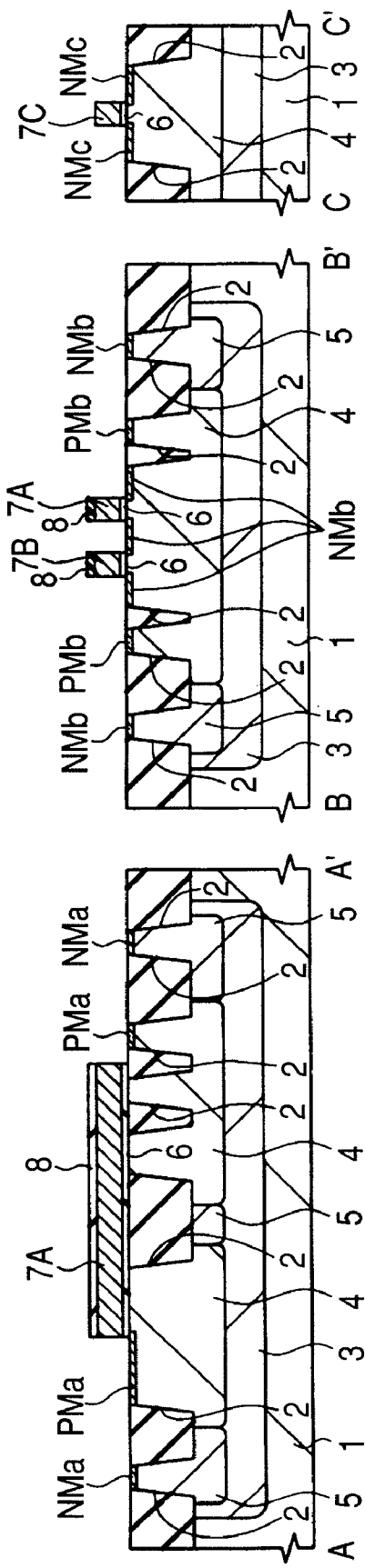
FIG. 4 is a fragmentary cross-sectional view of the semiconductor device during its manufacturing step following that of FIG. 2.

As illustrated in FIGS. 3 and 4, the substrate 1 is thermally oxidized to form a gate insulating film (first gate insulating film) 6 made of, for example, silicon oxide and having a film thickness of about 13.5 nm on the surface of each of the p wells 4 and n well 5. After formation of a polycrystalline silicon film over the gate insulating film 6, for example, by CVD, an insulating film made of a silicon oxide film is deposited, for example, by CVD over the polycrystalline silicon film. Prior to the formation of the insulating film, an n conductivity type impurity has been implanted into the polycrystalline silicon film. The insulating film in the peripheral circuit region is then removed by dry etching with a photoresist film (not illustrated) patterned by photolithography. An insulating film made of a silicon oxide film or the like having a film thickness of about 10 nm or greater is deposited, for example, by CVD over the substrate 1.

By dry etching with a photoresist film (not illustrated) patterned by photolithography, the insulating film on the substrate 1 is patterned. By dry etching with the remaining insulating film as a mask, the polycrystalline silicon film is patterned to form gate electrodes (first gate electrodes) 7A,7B, 7C. The insulating films over the gate electrodes 7A,7B,7C serve as a cap insulating film 8.

Lightly doped n type semiconductor regions NMa,NMb, NMc are formed by ion implantation of P or As as an n type impurity into a part of the p wells 4 and n well 5, while lightly doped p type semiconductor regions PMa,PMb are formed by ion implantation of boron as a p type impurity into a part of the p wells 4. These lightly doped n type semiconductor regions NMa,NMb,NMc and lightly doped p type semiconductor regions PMa,PMb are regions with a lower impurity concentration than n type semiconductor regions 14A,14B,14C and p type semiconductor regions 15A,15B which will be described later.

Figure 5:
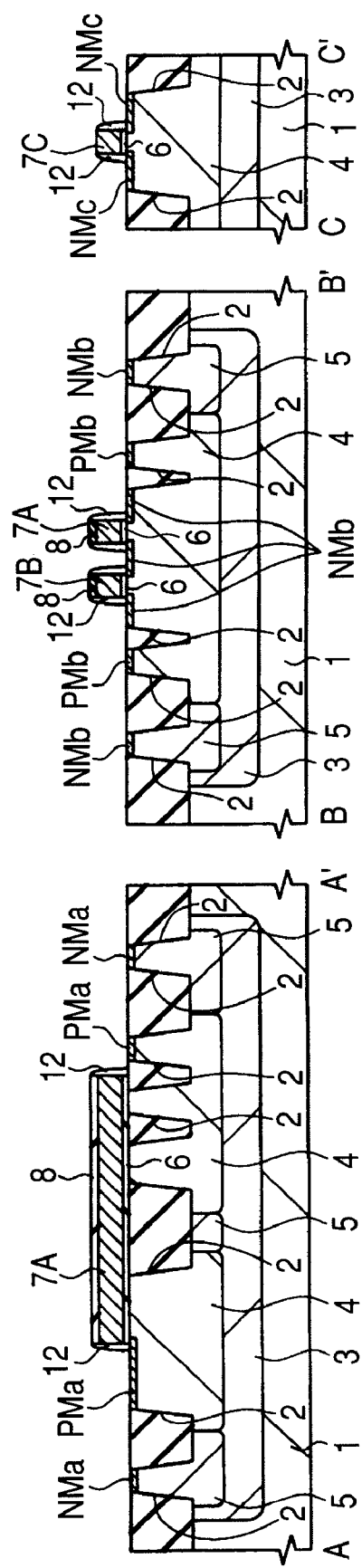
FIG. 5 is a fragmentary cross-sectional view of the semiconductor device during its manufacturing step following that of FIG. 4.

As illustrated in FIG. 5, after deposition of a silicon oxide film over the substrate 1 by CVD, the silicon oxide film and cap insulating film 8 are anisotropically etched to form sidewall spacers 12 over the sidewalls of the gate electrodes 7A,7B,7C and the cap insulating film 9. When the sidewall spacers 12 are formed from the silicon oxide film, the cap film 8 is removed from the peripheral circuit region, whereby the surface of the gate electrode 7C is exposed. This is because the thickness of the cap insulating film 8 in the memory cell region is thicker than that of the cap film 8 in the peripheral circuit region and etching stops at a position where the surface of the gate electrode 7C in the peripheral circuit region is exposed.

Figure 6:
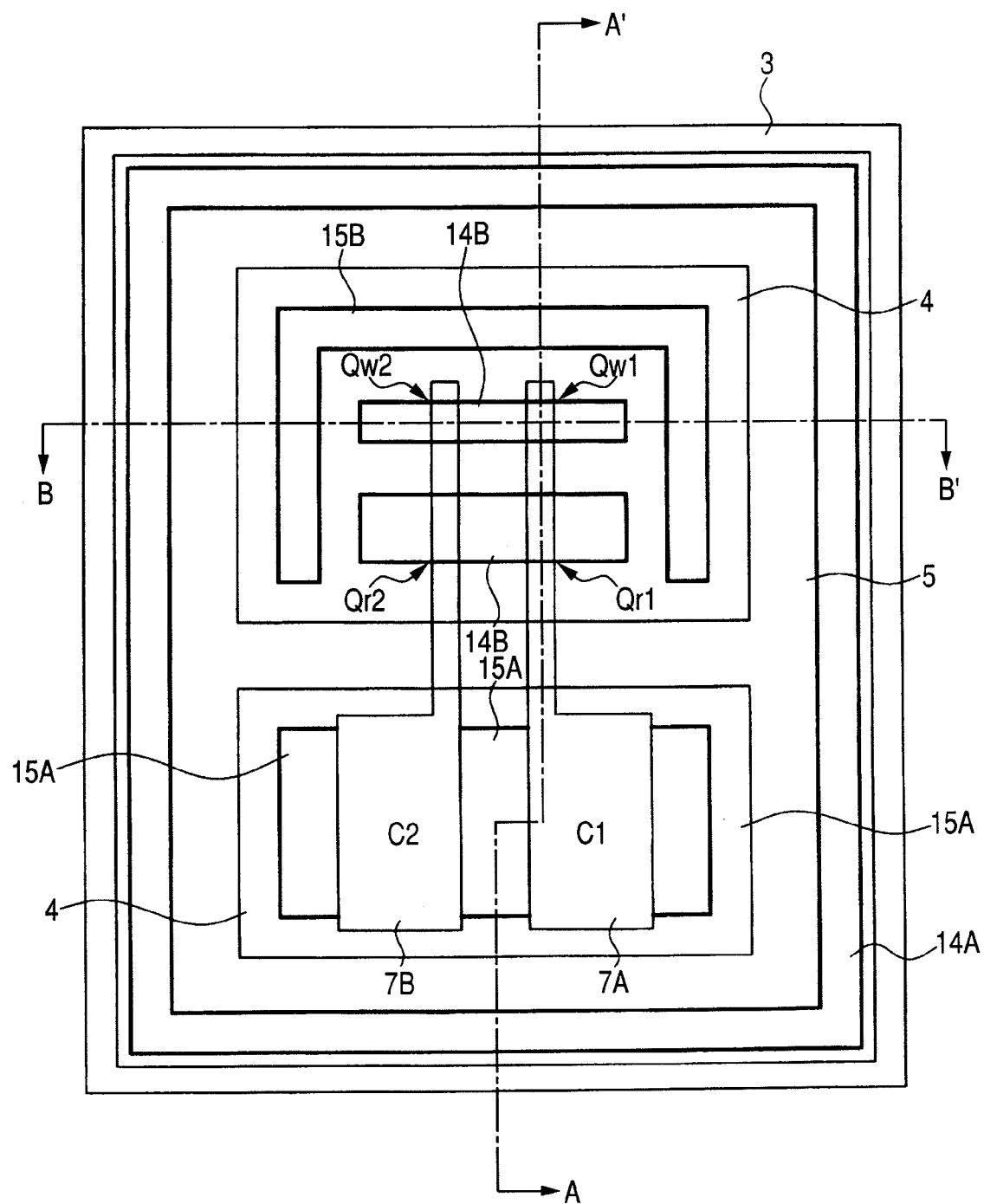
FIG. 6 is a fragmentary plan view of the semiconductor device during its manufacturing step following that of FIG. 3.
Figure 7:
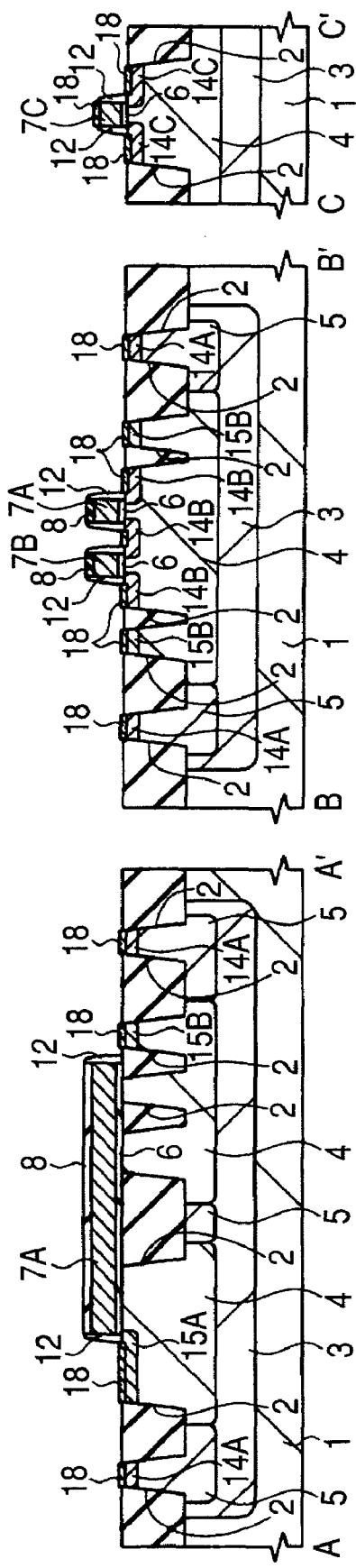
FIG. 7 is a fragmentary cross-sectional view of the semiconductor device during its manufacturing step following that of FIG. 4.

As illustrated in FIGS. 6 and 7, P or As is ion-implanted as an n type impurity into a part of the p wells 4 and n well 5 to form n type semiconductor regions 14A,14B,14C, while boron is ion-implanted as a p type impurity into a part of the p wells 4 to form p type semiconductor regions 15A,15B. In the drawings on and after FIG. 6 (except FIGS. 8 to 10), the description on the lightly doped n type semiconductor regions NMa,NMb,NMc and lightly doped p type semiconductor regions PMa,PMb is omitted in order to simplify the description and highly doped n type semiconductor regions 14A,14B,14C and highly doped p type semiconductor regions 15A,15B which will be described later will be illustrated as typical examples. By the steps so far mentioned, data writing and erasing MISFETs Qw1,Qw2 having the n type semiconductor region 14B as a source and drain, data reading MISFETs Qr1,Qr2 having the n type semiconductor region 14B as a source and drain, capacitive elements C1,C2 having the gate electrodes 7A,7B and p well 4 as a capacitive electrode and the gate insulating film 6 as a capacitive insulating film are formed in the memory cell region, while an n channel MISFET (first MISFET) having the n type semiconductor region 14C as a source and drain is formed in the peripheral circuit region. In the memory cell region, a nonvolatile memory element having the gate electrodes 7A,7B as a floating gate and the p type semiconductor region 15A as a control gate is formed.

Figure 8:
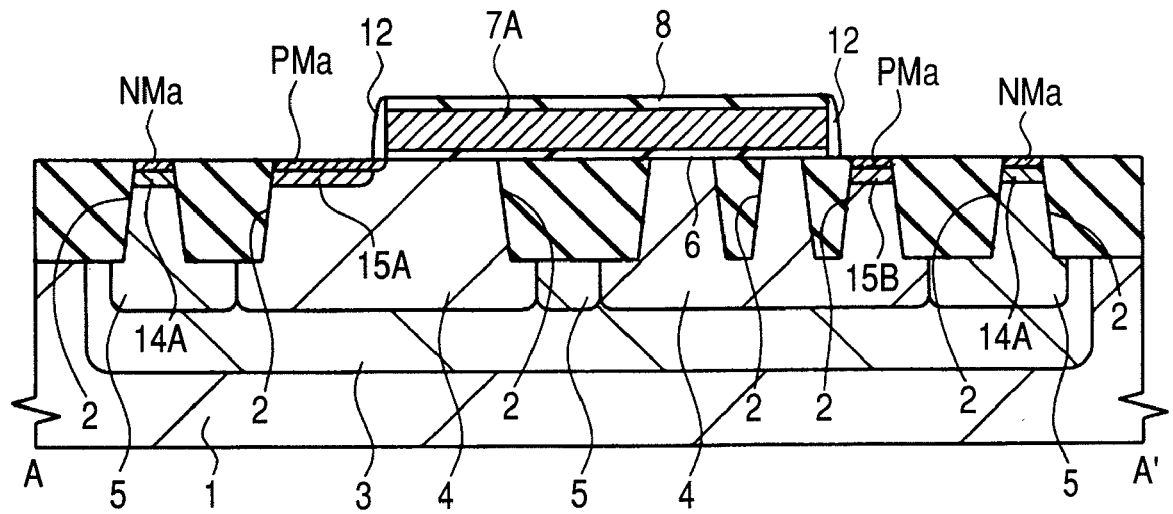
FIG. 8 is a fragmentary cross-sectional view illustrating an enlarged A-A' cross-section of FIG. 7.
Figure 9:
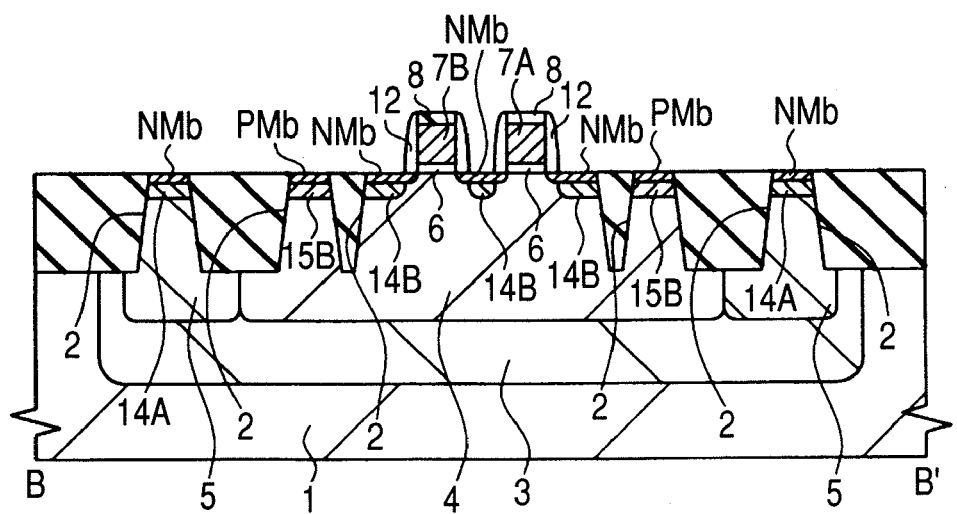
FIG. 9 is a fragmentary cross-sectional view illustrating an enlarged B-B' cross-section of FIG. 7.
Figure 10:
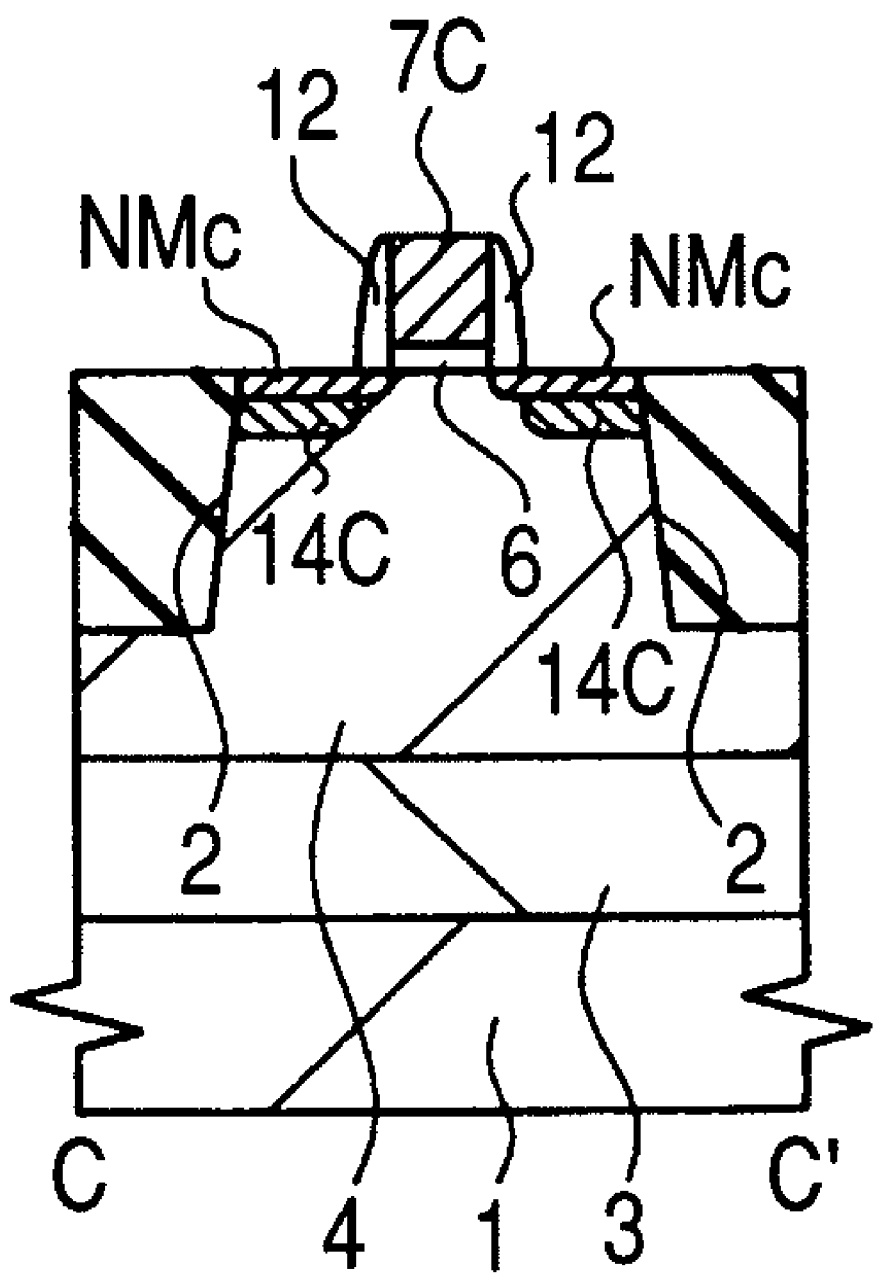
FIG. 10 is a fragmentary cross-sectional view illustrating an enlarged C-C' cross-section of FIG. 7.

An enlarged view of FIG. 7 is shown in each of FIGS. 8 to 10.

As illustrated in FIG. 8, a region which will be a control gate of the nonvolatile memory element is a region subjected to ion implantation for forming the lightly doped p type semiconductor region PMa and highly doped p type semiconductor region 15A. A feeder portion of the p wells 4 is a region subjected to ion implantation for forming the lightly doped p type semiconductor region PMa and highly doped p type semiconductor region 15B. Similarly, a feeder portion of the n well 5 is a region subjected to ion implantation for forming the lightly doped n type semiconductor region NMa and highly doped n type semiconductor region 14A.

As illustrated in FIG. 9, the source and drain regions of the data writing and erasing MISFETs Qw1,Qw2 and data reading MISFETs Qr1,Qr2 are each composed of the lightly doped n type semiconductor region NMb and highly doped n type semiconductor region 14B. Descriptions on feeder portions of the p well 4 and n well 5 are similar to those on the feeder portion of the p well 4 and n well 5 in FIG. 8.

As illustrated in FIG. 10, the source and drain regions of the n channel MISFET in the peripheral circuit region are each composed of the lightly doped n type semiconductor region NMb and highly doped n type semiconductor region 14B.

The impurity concentration of the lightly doped n type semiconductor region NMb of the data writing and erasing MISFETs Qw1,Qw2 can be made higher than that of the lightly doped n type semiconductor regions NMa,NMc. When the lightly doped n type semiconductor region NMb has such a higher impurity concentration, a generation amount of hot electrons during writing operation of the MISFETs Qw1,Qw2 can be increased, which makes it possible to speed up the writing operation of the memory cell.

In FIGS. 8 to 10, the lightly doped n type semiconductor regions NMa,NMb,NMc are thus illustrated in detail. The other diagrams (such as FIG. 7) do not include them in order to simplify the description but include only n type semiconductor regions 14A,14B,14C and p type semiconductor regions 15A,15B.

A silicide layer 18 is then formed. This silicide layer 18 is formed in the following manner. First, a Co (cobalt) film is deposited over the substrate 1, for example, by sputtering. The substrate 1 is heat treated to cause a silicide reaction on the interface between the Co film and gate electrode 7C in the peripheral circuit region and on the interface between the Co film and substrate 1. The unreacted Co film is then removed by etching, whereby a silicide ($CoSi_2$) layer 18 is formed on the surfaces of the gate electrode 7C and source and drain (n type semiconductor region 14). In the memory cell region, the silicide layer 18 is formed on the surface of the n type semiconductor region 14. Since the cap insulating film 8 remains on the surfaces of the gate electrodes 7A,7B, no silicide layer 18 is formed thereon. In Embodiment 1, Co (cobalt) is used as a material for the silicide layer 18, but without limitation to it, Ti (titanium), W (tungsten), Ni (nickel) or the like can also be used.

Figure 11:
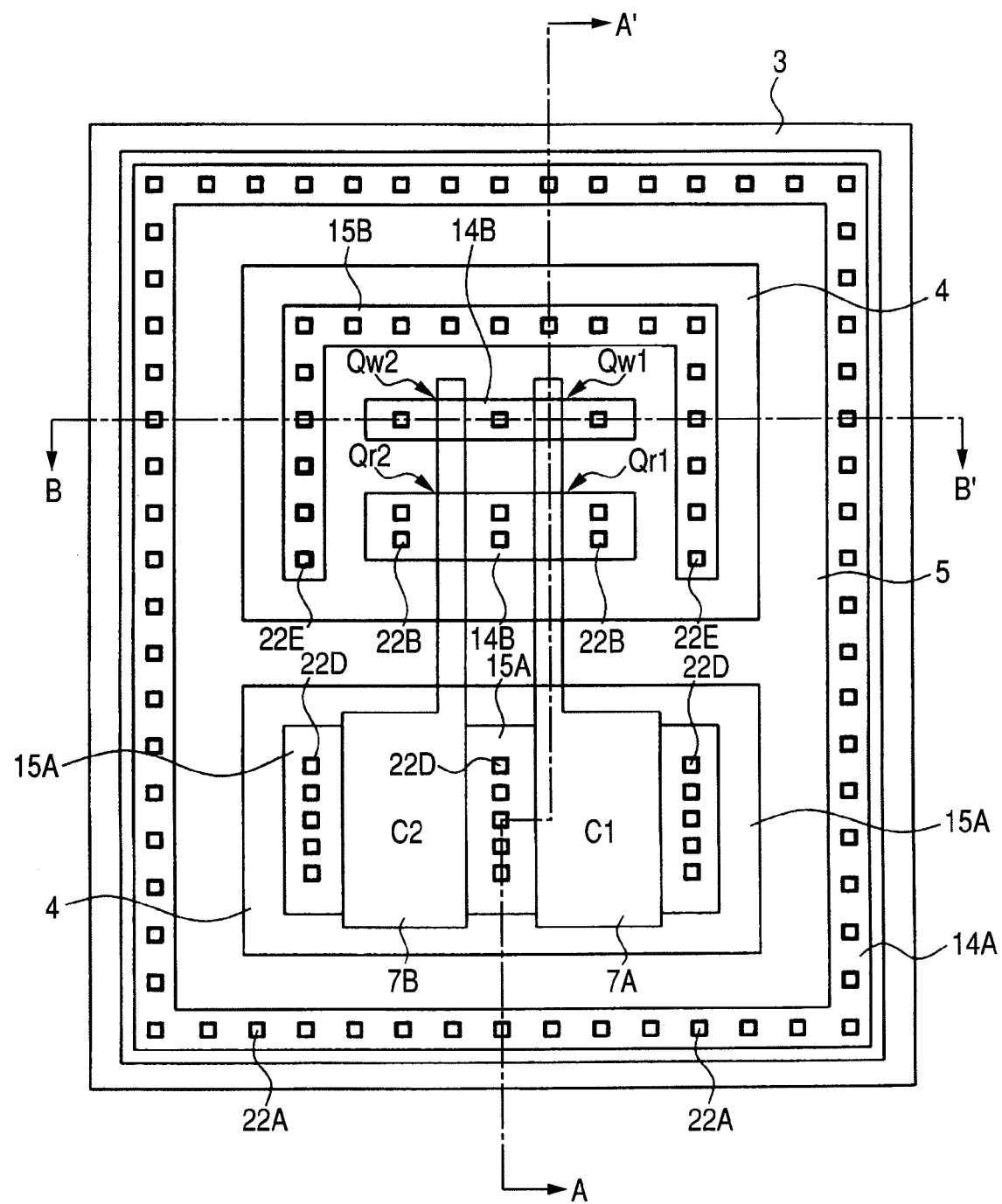
FIG. 11 is a fragmentary plan view of the semiconductor device during its manufacturing step following that of FIG. 6.
Figure 12:
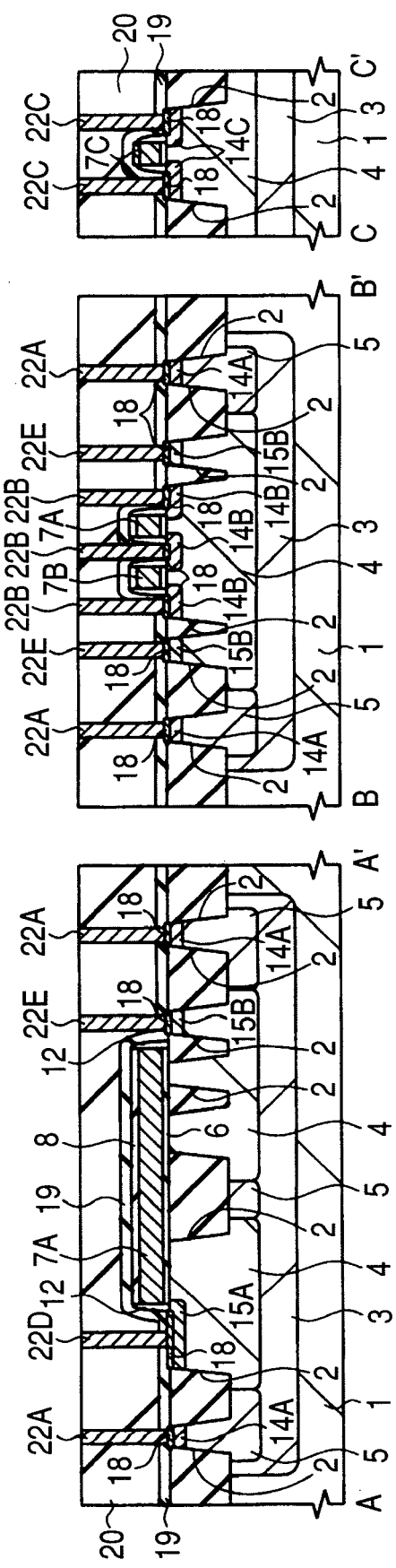
FIG. 12 is a fragmentary cross-sectional view of the semiconductor device during its manufacturing step following that of FIG. 7.

As illustrated in FIGS. 11 and 12, a silicon nitride film 19 is deposited over the substrate 1 by plasma CVD so as to cover the gate electrodes 7A,7B,7C, cap insulating film 8 and sidewall spacers 12. When an interlayer insulating film is formed over the substrate 1 and then contact holes extending down to the n type semiconductor regions 14A,14B,14C and p type semiconductor regions 15A,15B are formed in the interlayer insulating film in the later step, by increasing a difference in an etching selectivity between this silicon nitride film 19 and the silicon oxide film embedded in the element isolation trench, the silicon nitride film functions to prevent the contact holes from reaching the substrate even if the contact holes are formed over the element isolation trench owing to misalignment. It also functions to prevent the etching of the surface of the silicide layer 18 by overetching. In short, the silicon nitride film 19 functions as an etching stopper.

A silicon oxide film 20 is then deposited over the substrate 1, for example, by CVD, and the surface of the silicon oxide film 20 is planarized by chemical mechanical polishing. With a photoresist film as a mask, the silicon oxide film 20 and silicon nitride film 19 are dry etched, whereby contact holes reaching the n type semiconductor regions 14A,14B,14C and p type semiconductor regions 15A,15B, respectively are formed. At this time, the silicon nitride film 19 serves as an etching stopper film when the silicon oxide film 20 is etched. Plugs 22A to 22E are then formed inside of the contact holes. The plug 22A reaches the silicide layer 18 over the n type semiconductor region 14A, the plug 22B reaches the silicide layer 18 over the n type semiconductor region 14B, the plug 22C reaches the silicide layer 18 over the n type semiconductor region 14C, the plug 22D reaches the silicide layer 18 over the p type semiconductor region 15A, and the plug 22E reaches the silicide layer 18 over the p type semiconductor region 15B. The plugs 22A to 22E are formed, for example, by depositing a Ti (titanium) film and TiN (titanium nitride) film over the silicon oxide film 20 including the inside of the contact holes by sputtering, depositing a TiN film and, as a metal film, a W (tungsten) film by CVD and then, removing the W film, TiN film and Ti film outside the contact holes by chemical mechanical polishing.

According to the manufacturing method of the semiconductor device of Embodiment 1, a nonvolatile memory can be formed by the manufacturing steps of a complementary MISFET without adding thereto another step.

Figure 13:
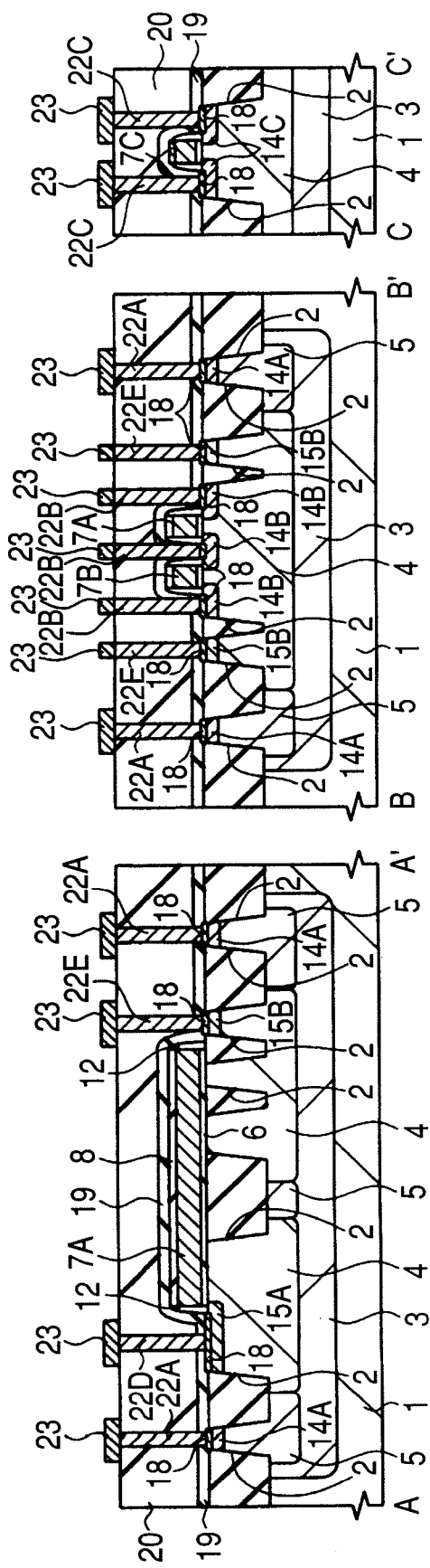
FIG. 13 is a fragmentary cross-sectional view of the semiconductor device during its manufacturing step following that of FIG. 12.

As illustrated in FIG. 13, a plurality of interconnects 23 are formed over the silicon oxide film 20 and plugs 22A to 22E. The interconnects 23 are formed, for example, by depositing a Ti film, Al (aluminum) alloy film and TiN film successively over the silicon oxide film 20 by sputtering, and patterning these Ti film, Al alloy film and TiN film by dry etching with a photoresist film as a mask. The number of interconnect layers to be stacked may be increased further by repeating steps similar to those employed for the formation of the silicon oxide film 20 and interconnects 23.

Figure 14:
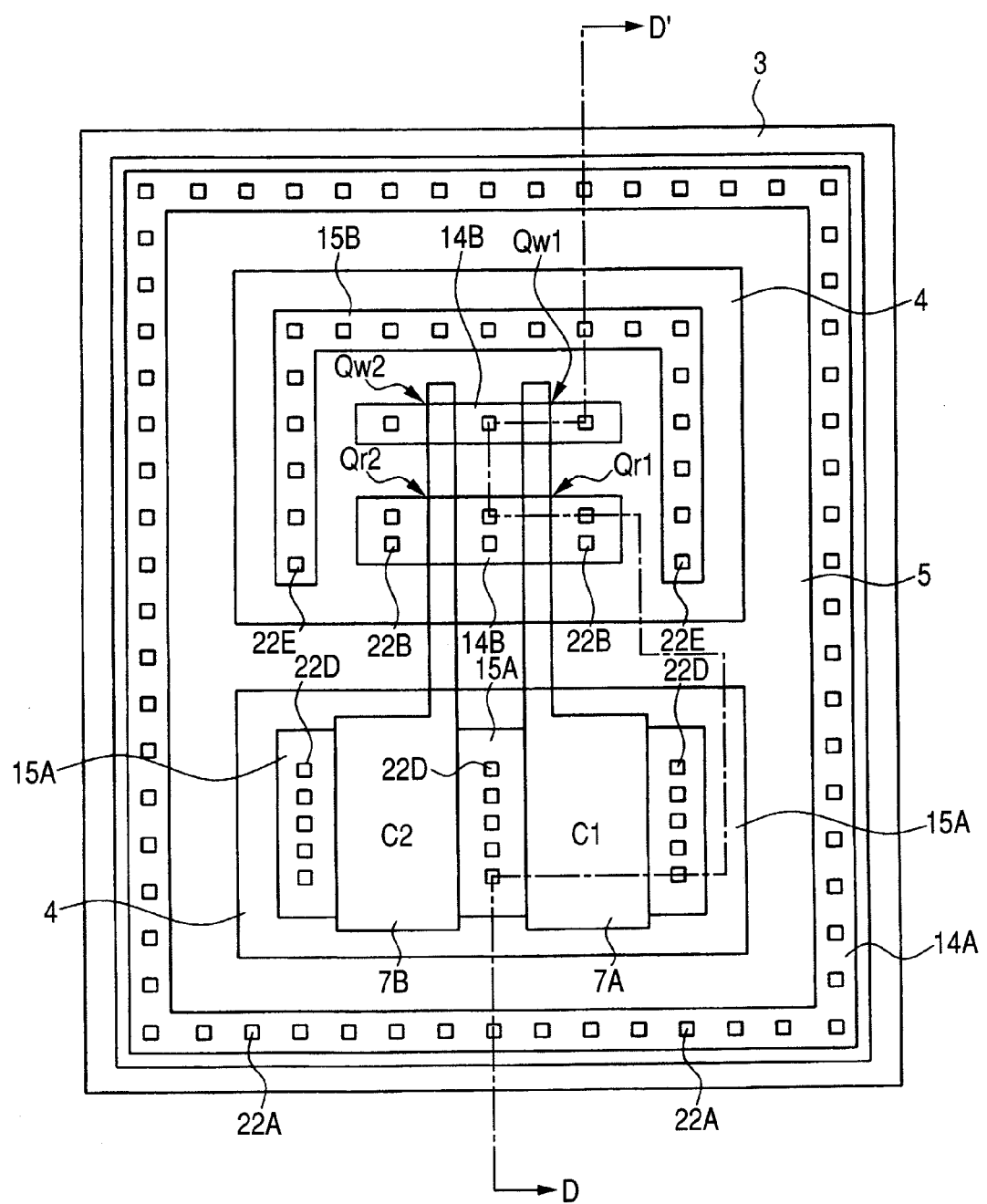
FIG. 14 is a fragmentary plan view of the semiconductor device according to Embodiment 1 of the present invention.
Figure 15:
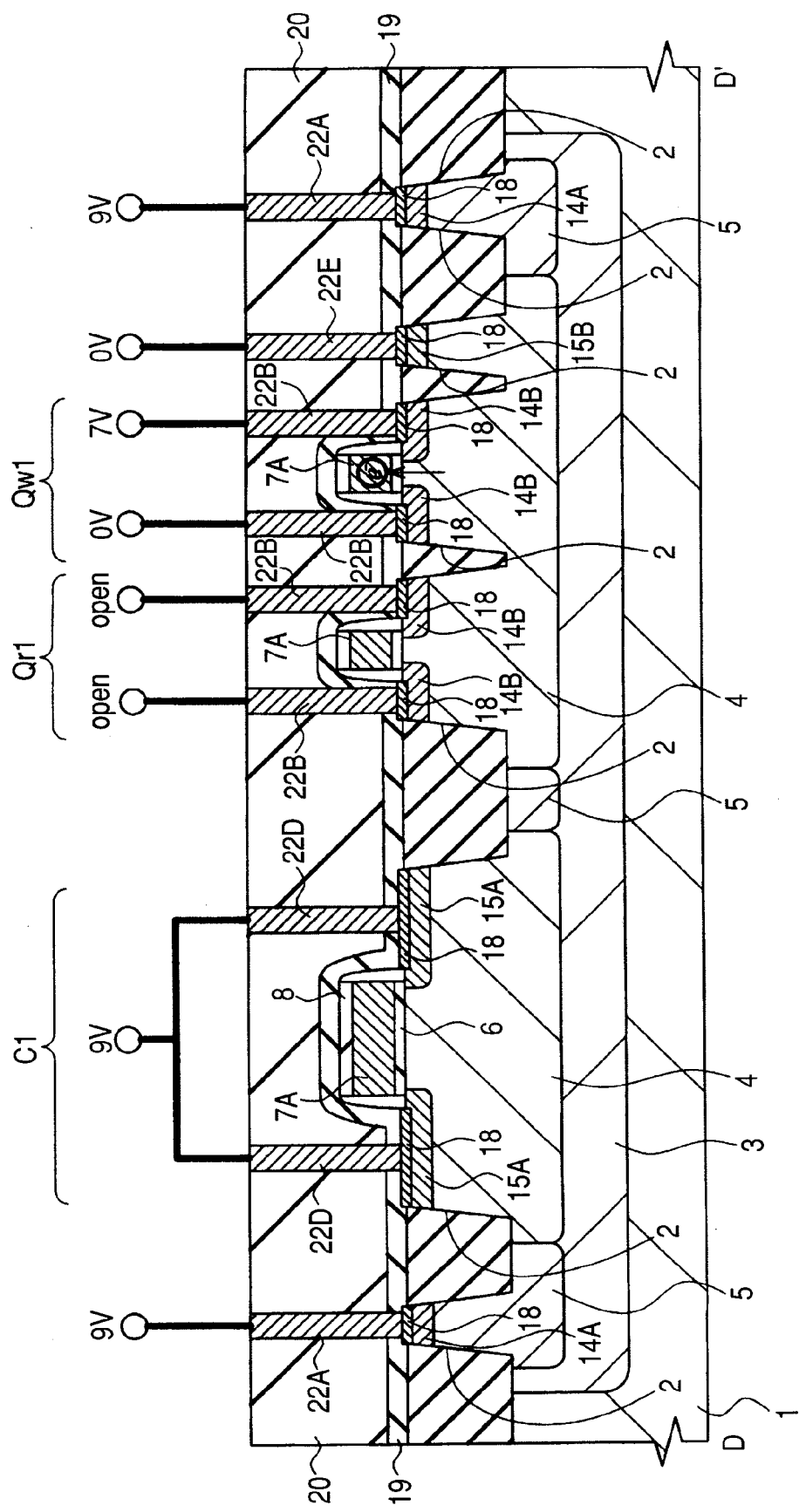
FIG. 15 is a fragmentary cross-sectional view illustrating the data writing operation of a nonvolatile memory of the semiconductor device according to Embodiment 1 of the present invention.
Figure 16:
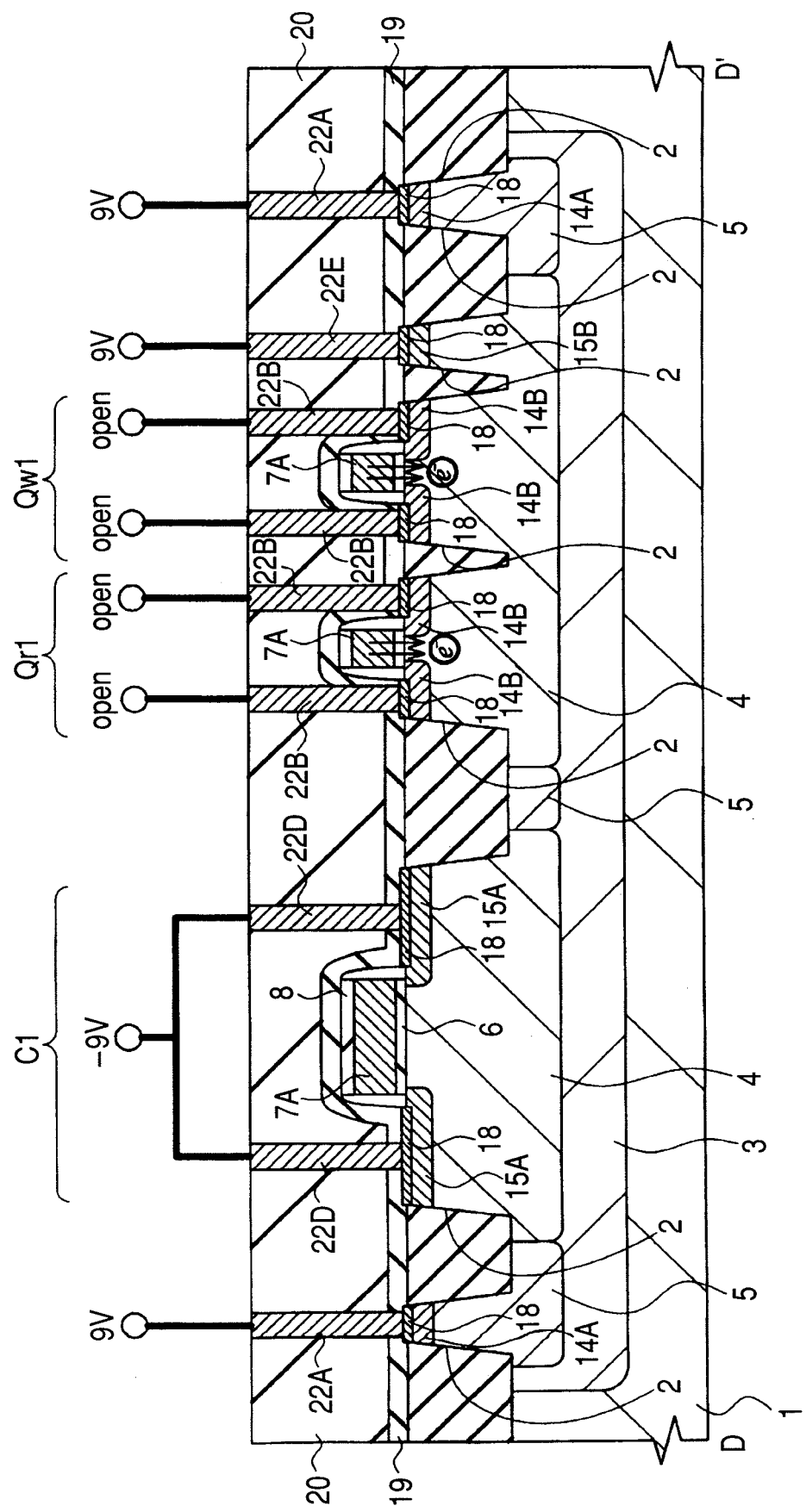
FIG. 16 is a fragmentary cross-sectional view illustrating the data erasing operation of the nonvolatile memory of the semiconductor device according to Embodiment 1 of the present invention.
Figure 17:
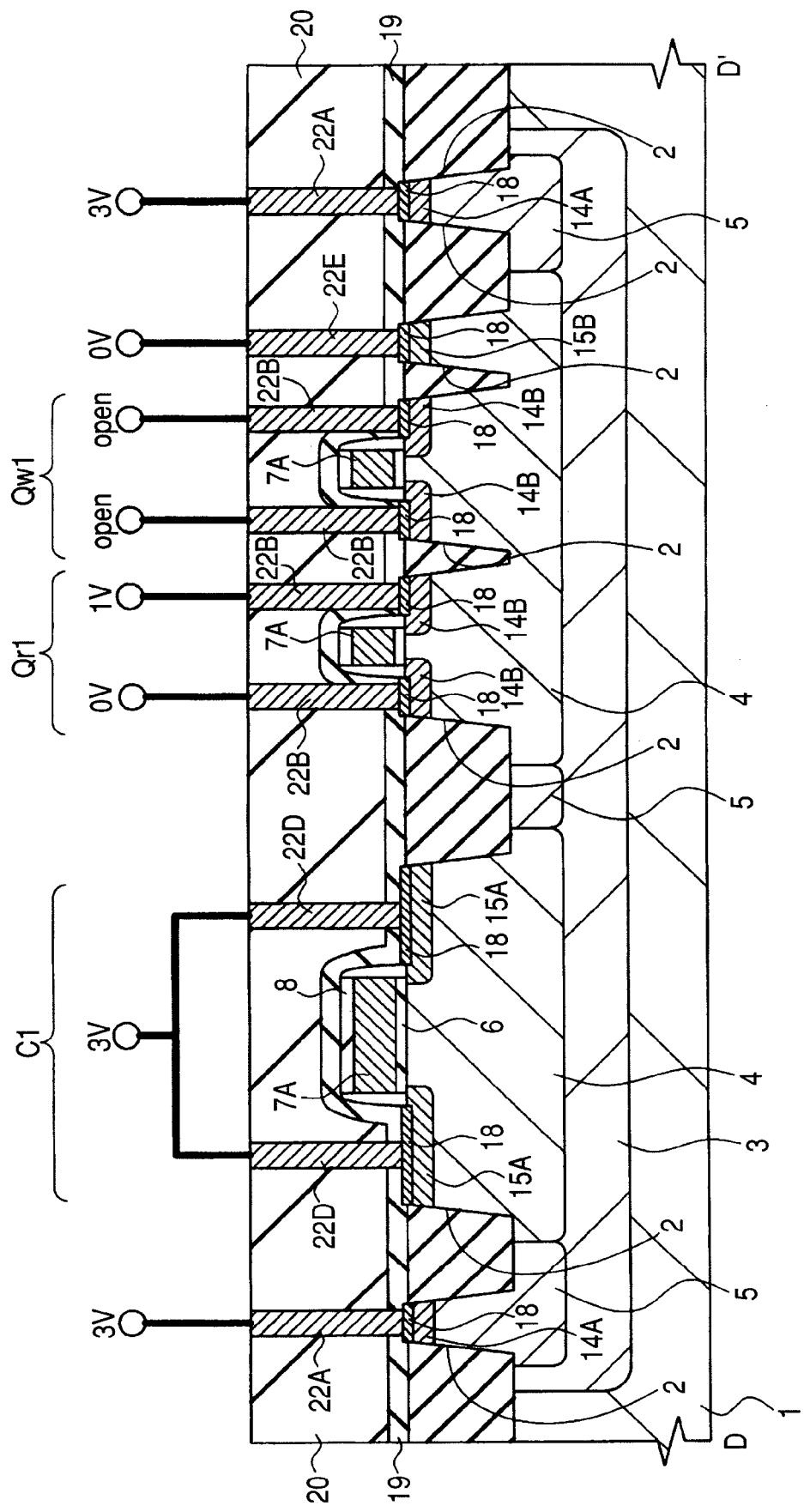
FIG. 17 is a fragmentary cross-sectional view illustrating the data reading operation of the nonvolatile memory of the semiconductor device according to Embodiment 1 of the present invention.

Writing, erasing and reading operations in the nonvolatile memory in Embodiment 1 will be described with reference to FIGS. 14 to 17. FIG. 14 is a fragmentary plan view of the memory cell region and FIGS. 15 to 17 are cross-sections taken along a line D-D' in FIG. 14. In FIGS. 14 to 17, the interconnects 23 are not illustrated in order to facilitate the understanding of the description.

As illustrated in FIG. 15, writing of data is carried out by applying 9V to the n well 5 (n type semiconductor isolation region 3), 0V to the p type semiconductor regions 15B (the p wells 4 having the MISFETs Qw1,Qw2,Qr1,Qr2 formed thereover), 9V (first voltage), that is, a forward voltage, to the p type semiconductor regions 15A (the p wells 4 having the capacitive elements C1,C2 formed thereover), 7V (second voltage) to one of the source and drain (n type semiconductor regions 14B) of the data writing and erasing MISFETs Qw1, Qw2, and 0V to the other one, and setting the source and drain (n type semiconductor regions 14B) of the data reading MISFETs Qr1,Qr2 at open potential. By this, channel hot electrons (e$^-$) are injected into the gate electrode 7A in the data writing and erasing MISFETs Qw1,Qw2, whereby writing of data is carried out.

Erasing of data is carried out, as illustrated in FIG. 16, by applying 9V to the n well 5 (the n type semiconductor isolation region 3), 9V to the p type semiconductor regions 15B (the p wells 4 having the MISFETs Qw1,Qw2,Qr1,Qr2 formed thereover), and −9V, that is, a reverse voltage, to the p type semiconductor regions 15A (the p wells 4 having the capacitive elements C1,C2 formed thereover), and setting the source and drain (n type semiconductor regions 14B) of the data writing and erasing MISFETs Qw1,Qw2 and data reading MISFETs Qr1,Qr2 at open potential. The capacitive electrodes (gate electrodes 7A,7B) of the capacitive elements C1,C2 have a greater area than the capacitive electrodes (gate electrodes 7A,7B) forming a gate capacitance of the MISFETs Qw1,Qw2 (refer to FIG. 14) so that the capacitance of the capacitive elements C1,C2 becomes greater than the gate capacitance (formed between the gate electrodes 7A,7B and the channel of MISFETs Qw1,Qw2) of the MISFETEs Qw1, Qw2. The voltage to be applied to the gate capacitance of the MISFETs Qw1,Qw2 therefore becomes greater than the voltage to be applied to the capacitive elements C1,C2, whereby in the data writing and erasing MISFETs Qw1,Qw2 and data reading MISFETs Qr1,Qr2, electrons (e$^-$) are emitted to the p well 4 from the gate electrode 7A by FN tunneling. As a result, deterioration of an element, which will otherwise occur owing to the concentration of an electric field at the end portion of the drain (n type semiconductor region 14B) can be prevented. Since the deterioration of an element can be prevented, leakage of charges can also be prevented. This makes it possible to prevent the deterioration of data retaining properties of the nonvolatile memory. In addition, by applying a negative (reverse) voltage to the p well 4 over which the capacitive elements C1,C2 are formed and applying a positive (forward) voltage to the p well 4 over which the MISFETs Qw1,Qw2,Qr1,Qr2 are formed, it becomes possible to maintain a potential difference (18V) necessary for data erasing operation at a voltage (9V or less) not causing gate breakage.

Reading of data is carried out, as illustrated in FIG. 17, by applying 3V to the n well 5 (the n type semiconductor isolation region 3), 0V to the p type semiconductor regions 15B (the p wells 4 having the MISFETs Qw1,Qw2,Qr1,Qr2 formed thereover), and 3V to the p type semiconductor regions 15A (the p wells 4 having the capacitive elements C1,C2 formed thereover), setting the source and drain (n type semiconductor regions 14B) of the data writing and erasing MISFETs Qw1,Qw2 at open potential, and applying 1V to one of the source and drain (n type semiconductor region 14B) of the data reading MISFETs Qr1,Qr2 and 0V to the other one. By this, the data reading MISFETs Qr1,Qr2 are turned ON.

In Embodiment 1, the data writing and erasing MISFETs (Qw1,Qw2) and data reading MISFETs (Qr1,Qr2) are formed, respectively. Alternatively, it is also possible to omit one of them and perform all of the data writing, data erasing and data reading operations by one MISFET.

The nonvolatile memory as described in Embodiment 1 can be used, for example, as a fuse circuit by accumulating voltage control data (picture quality control data) in an LCD (Liquid Crystal Display) driver. In this case, the module can be downsized compared with that of an OTPROM type fuse circuit which requires a memory capacity corresponding to the rewriting frequency, because data rewriting can be carried out according to need. In addition, the downsizing of the module leads to a reduction in the manufacturing cost of the module.

Another use of the nonvolatile memory according to Embodiment 1 is relief of a defective memory cell of DRAM (Dynamic Random Access Memory) having a redundant configuration. At this time, the memory cell becomes a unit information cell and by a plurality of the gathered information cells, an electrical programming circuit for nonvolatile memory element is formed. The plurality of unit information cells becomes a memory circuit of a relief information for a circuit to be relieved. This makes it possible to enhance the reliability of defect relief.

A fuse programming circuit for storing relief information in accordance with the fused state of a fuse element may be disposed as another relief information memory circuit for the above-described circuit to be relieved. It is possible to raise a relief efficiency by using a fuse programming circuit for the relief of a defect detected at the stage of a wafer, while using the above-described electrical programming circuit for the relief of a defect detected after burn-in.

The above-described relief circuit may be a memory cell of a microcomputer with built-in DRAM or a memory cell of a microcomputer with built-in SRAM. It may constitute a relief circuit of an LCD driver.

Embodiment 2

Writing, erasing and reading operations in a nonvolatile memory according to Embodiment 2 will next be described with reference to FIG. 18.

Figure 18:
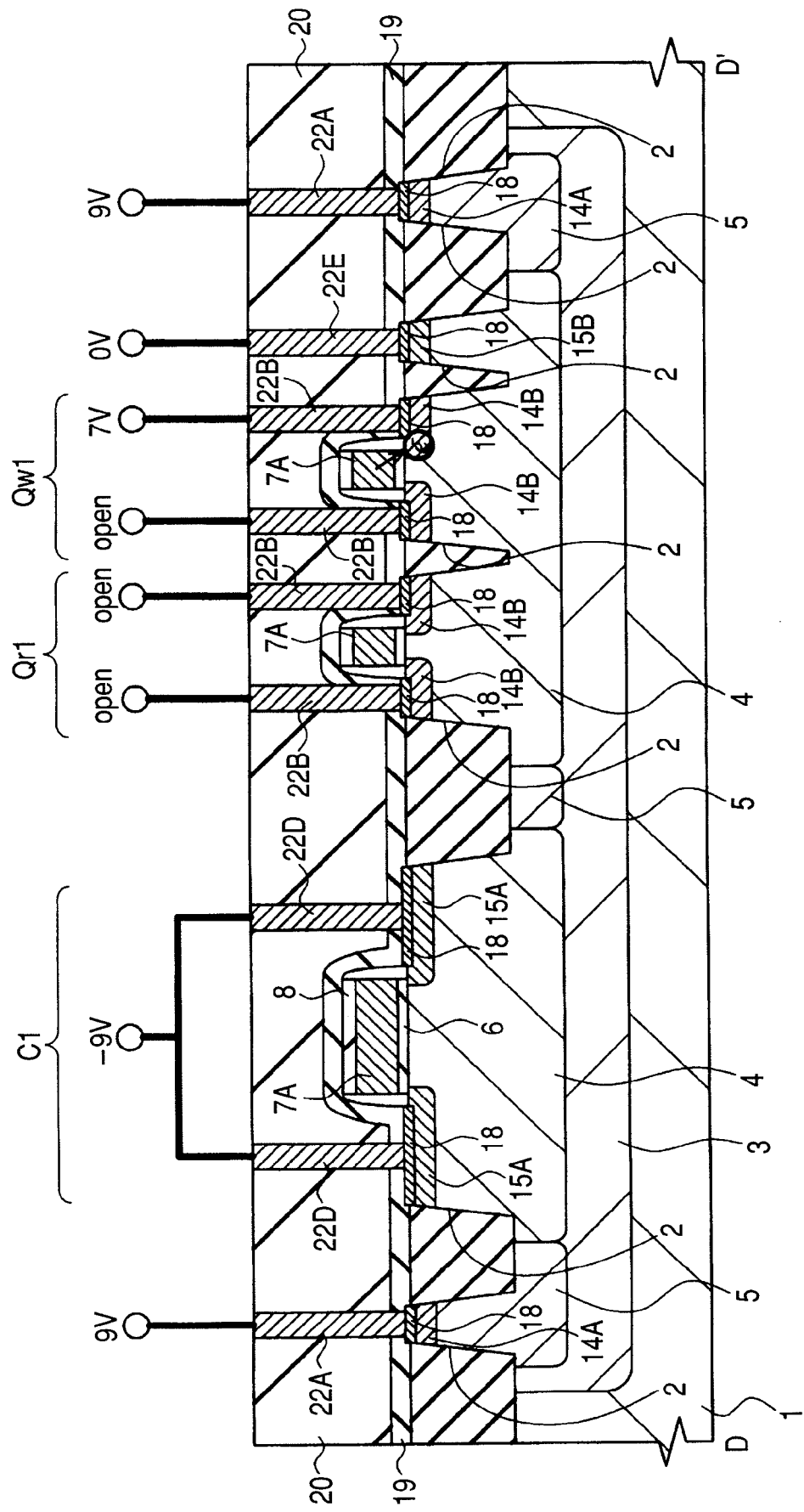
FIG. 18 is a fragmentary cross-sectional view illustrating the data erasing operation of a nonvolatile memory of a semiconductor device according to Embodiment 2 of the present invention.

FIG. 18 illustrates a cross-section taken along a line b-D' of FIG. 14 in Embodiment 1. As illustrated in FIG. 18, the nonvolatile memory of Embodiment 2 has almost a similar structure to that of the nonvolatile memory according to Embodiment 1.

The writing and reading operations of data in the nonvolatile memory of Embodiment 2 are similar to those of the nonvolatile memory of Embodiment 1. As illustrated in FIG. 18, erasing of data is carried out by applying 9V to the n well 5 (n type semiconductor isolation region 3), 0V is applied to the p type semiconductor regions 15B (the p wells 4 having MISFETs Qw1,Qw2,Qr1,Qr2 formed thereover), −9V to the p type semiconductor regions 15A (the p wells 4 having the capacitive elements C1,C2 formed thereover), and 7V to the drain (n type semiconductor region 14B) of the data writing and erasing MISFETs Qw1,Qw2, and setting the source (n type semiconductor regions 14B) at open potential and the source and drain (n type semiconductor regions 14B) of the data reading MISFET Qr1,Qr2 at open potential. At this time, in the data writing and erasing MISFETs Qw1,Qw2, electric field concentration at the end portion of the gate electrode 7A occurs so that electrons (e⁻) can be emitted from the gate electrode 7A even at a voltage (7V) lower than that (9V) at the data erasing operation in Embodiment 1. In the data writing and erasing MISFETs Qw1,Qw2, electrons (e⁻) are emitted from the end portion of the gate electrode 7A to the drain (n type semiconductor region 14B) of the data writing and erasing MISFETs Qw1,Qw2.

In the data writing and erasing MISFETs Qw1,Qw2, an electric field concentration occurs at the end portion of the gate electrode 7A so that the gate insulating film 6 is formed with a film thickness (for example, about 13.5 nm) thick enough to endure the electric field concentration, whereby element deterioration of the data writing and erasing MISFETs Qw1,Qw2 can be prevented.

This Embodiment 2 brings about similar advantages to those available by Embodiment 1.

Embodiment 3

Data writing, erasing and reading operations in a nonvolatile memory according to Embodiment 3 will next be described with reference to FIG. 19.

Figure 19:
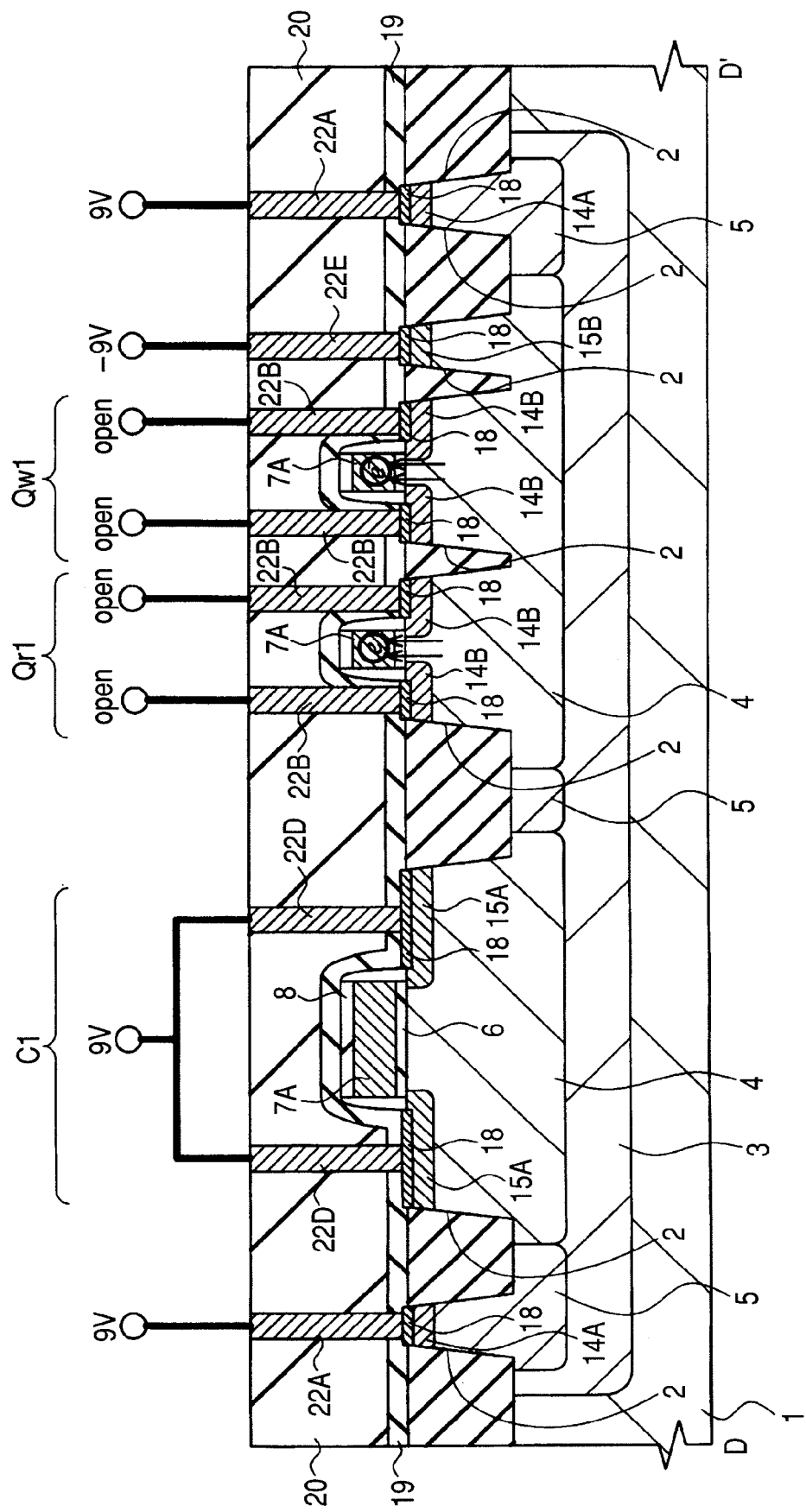
FIG. 19 is a fragmentary cross-sectional view illustrating the data writing operation of a nonvolatile memory of a semiconductor device according to Embodiment 3 of the present invention.

FIG. 19 illustrates the cross-section taken along a line D-D' of FIG. 14 in Embodiment 1. As illustrated in FIG. 19, the nonvolatile memory of Embodiment 3 has almost a similar structure to that of the nonvolatile memory of Embodiment 1.

The data erasing and reading operations in the nonvolatile memory of Embodiment 3 are similar to those of the nonvolatile memory of Embodiment 1. As illustrated in FIG. 19, writing of data is carried out by applying 9V to the n well 5 (n type semiconductor isolation region 3), −9V to the p type semiconductor regions 15B (the p wells 4 having the MISFETs Qw1,Qw2,Qr1,Qr2 formed thereover), and 9V to the p type semiconductor regions 15A (the p wells 4 having the capacitive elements C1,C2 formed thereover), and setting the source and drain (n type semiconductor regions 14B) of the data writing and erasing MISFETs Qw1,Qw2 and data reading MISFETs Qr1,Qr2 at open potential. By this, in the data writing and erasing MISFETs Qw1,Qw2 and data reading MISFET Qr1,Qr2, electrons (e⁻) are injected into the gate electrode 7A all over the channel by the FN tunneling and data writing is carried out.

In the above-described Embodiment 3, similar advantages to those obtained in Embodiment 1 are available.

Embodiment 4

Figure 20:
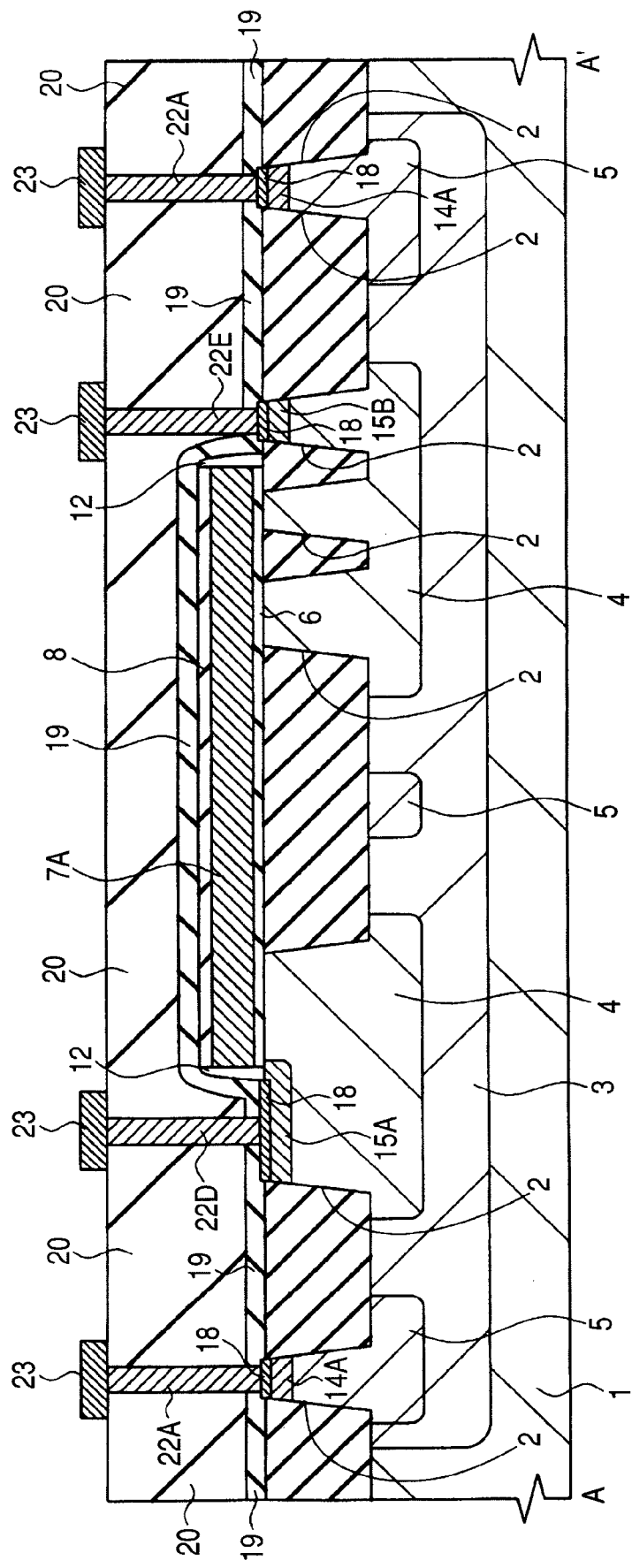
FIG. 20 is a fragmentary cross-sectional view of a semiconductor device according to Embodiment 4 of the present invention.

FIG. 20 is a fragmentary cross-sectional view of the memory cell portion of a semiconductor device according to Embodiment 4. It corresponds to the cross-section taken along a line A-A' of each plan view illustrated in Embodiment 1.

When the junction breakdown voltage between the p well 4 and n well 5 becomes insufficient owing to miniaturization of a semiconductor element or interconnect, the p well 4 and n well 5 may be separated from each other as illustrated in FIG. 20. By this, the junction breakdown voltage between the p well 4 and n well 5 can be improved. When a space between two p wells 4 is sufficiently wide, the n well 5 may be omitted.

Similar advantages to those of Embodiment 1 are available by the above-described Embodiment 4.

Embodiment 5

The data erasing operation in a nonvolatile memory according to Embodiment 5 will next be described.

Figure 21:
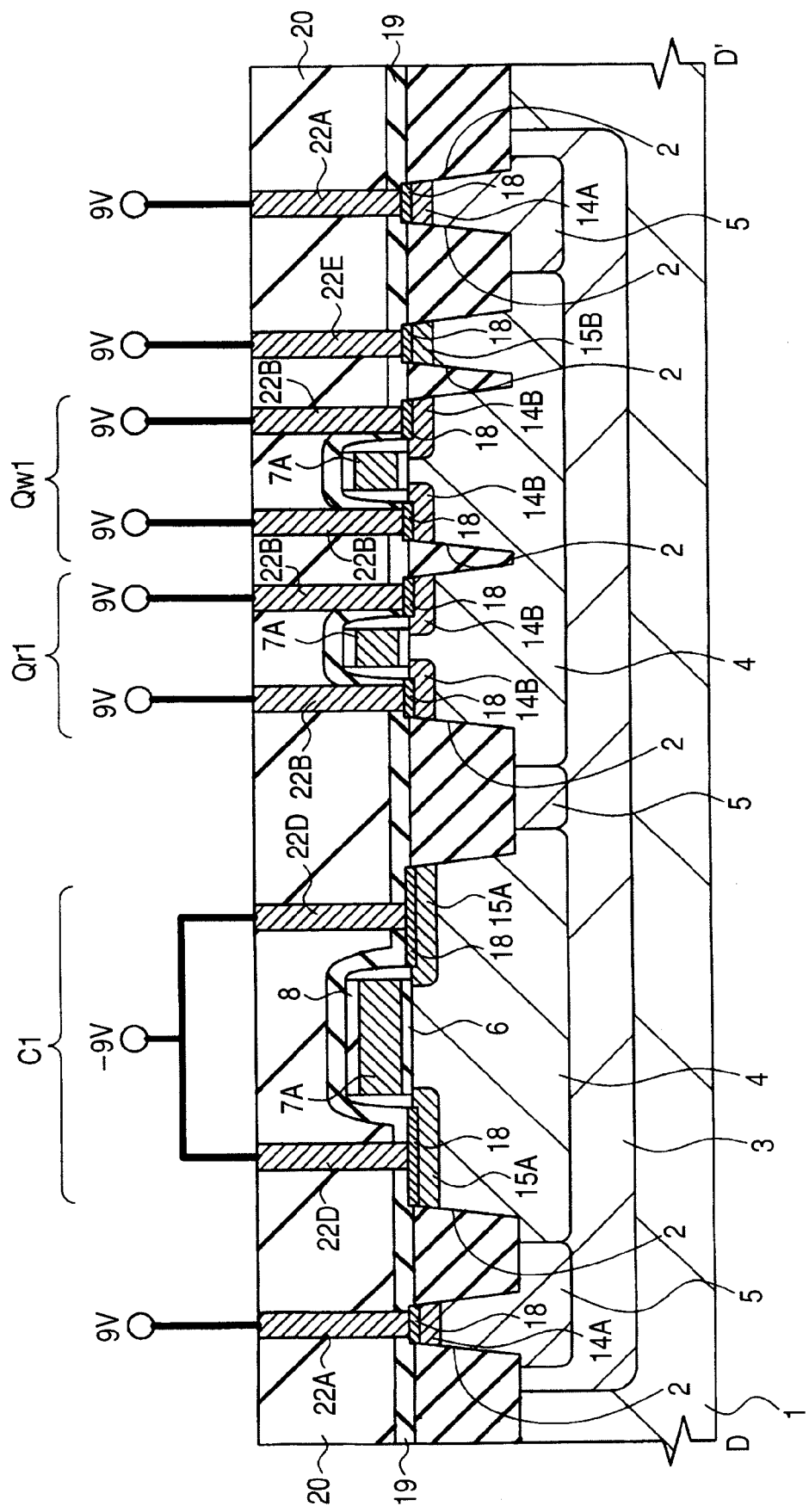
FIG. 21 is a fragmentary cross-sectional view illustrating the data erasing operation of a nonvolatile memory of a semiconductor device according to Embodiment 5 of the present invention.

FIG. 21 illustrates a cross-section taken along a line D-D' in FIG. 14 in Embodiment 1. As illustrated in FIG. 21, the nonvolatile memory of Embodiment 5 has almost a similar structure to that of the nonvolatile memory of Embodiment 1.

In the nonvolatile memory according to Embodiment 5, erasing of data is carried out by applying 9V to the n well 5 (n type semiconductor isolation region 3), 9V to the p type semiconductor regions 15B (the p wells 4 having the MISFETs Qw1,Qw2,Qr1,Qr2 formed therein), −9V to the p type semiconductor regions 15A (the p wells 4 having the capacitive elements C1,C2 formed thereover), and 9V to the source and drain of the data writing and erasing MISFETs Qw1,Qw2 and the source and drain (n type semiconductor regions 14B) of the data reading MISFETs Qr1,Qr2. To set the drain of the data writing and erasing MISFETs Qw1,Qw2 at open potential as in Embodiment 1 when erasing of data is carried out, another control MISFET becomes necessary, which disturbs downsizing of a semiconductor device. In this Embodiment 5, therefore, a similar operation condition to that of Embodiment 1 is available by applying 9V to the source and drain of the data writing and erasing MISFETs Qw1,Qw2 and the source and drain of the data reading MISFETs Qr1,Qr2.

Figure 22:
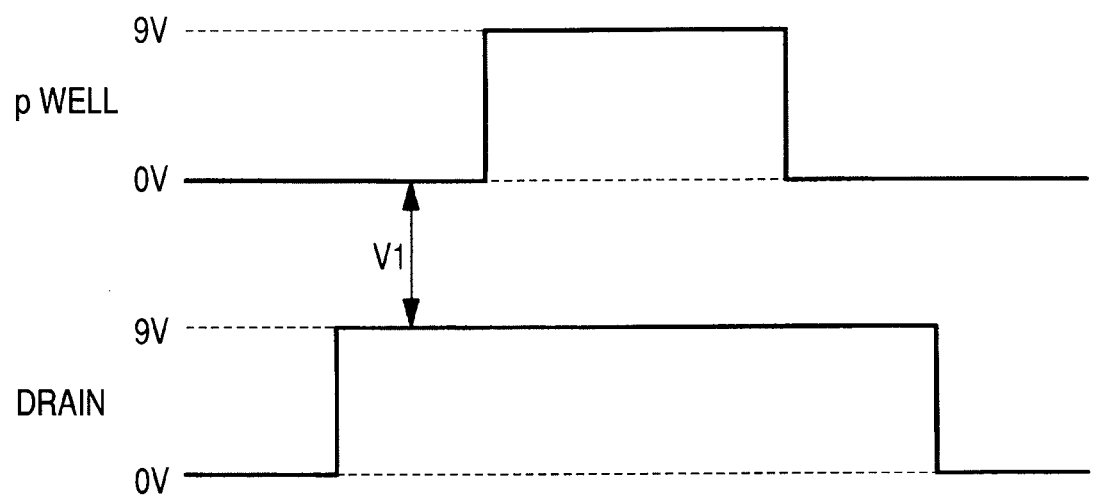
FIG. 22 is a schematic view illustrating the timing of voltage application when erasing of data is carried out in the nonvolatile memory of the semiconductor device according to Embodiment 5 of the present invention.

In the channel region of the data writing and erasing MISFETs QW1,Qw2, the impurity concentration is adjusted to be high so as to facilitate generation of hot electrons and the junction breakdown voltage is suppressed to about 7V or less, which is lower than the voltage (9V or less) causing no gate breakage as described in Embodiment 1. As illustrated in FIG. 22, 9V is therefore applied to the drain of the MISFETs Qw1,Qw2 prior to the application of 9V to the p well 4. When the voltage of the p well 4 is reduced to 0V prior to a reduction of the drain voltage of the MISFETs Qw1,Qw2 to 0V, the potential difference V1 between them exceeds the junction breakdown voltage, leading to junction breakage. In the example shown in Embodiment 5, therefore, a potential difference between them is suppressed so as not to exceed about 7V by applying, at a timing as illustrated in FIGS. 23 and 24, a voltage to the p wells 4 over which the MISFETs Qw1,Qw2, Qr1,Qr2 have been formed and the drains (n type semiconductor regions 14B) of the data writing and erasing MISFETs Qw1,Qw2 when erasing of data is carried out.

Figure 23:
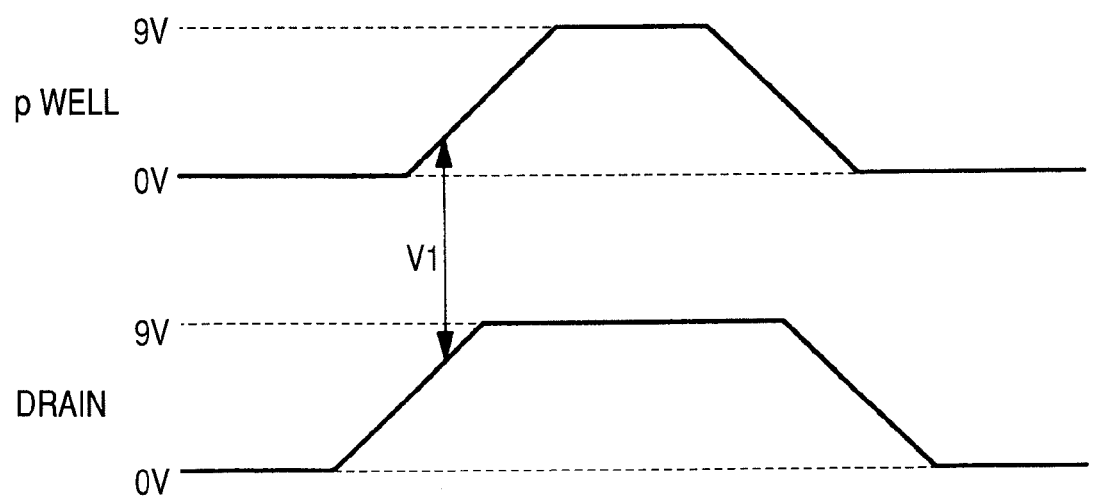
FIG. 23 is a schematic view illustrating the timing of voltage application when erasing of data is carried out in the nonvolatile memory of the semiconductor device according to Embodiment 5 of the present invention.

For example, as illustrated in FIG. 23, application of a voltage to the drain of the MISFETs Qw1,Qw2 is started before the application of a voltage to the p well 4 is started. At this time, these voltages are not increased drastically but gradually so that the potential difference V1 between them does not exceed the junction breakdown voltage, that is, about 7V. By reducing the voltage of the p well 4 to 0V prior to a reduction in the drain voltage of the MISFETs Qw1,Qw2 to 0V. By avoiding a drastic change in their voltage, it is possible to avoid a potential difference between them from exceeding about 7V.

Figure 24:
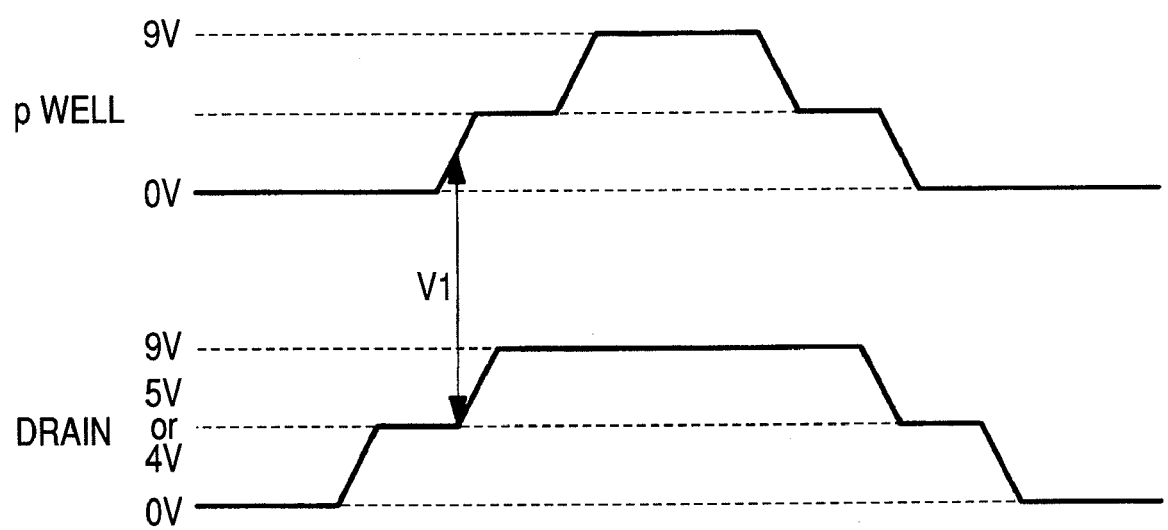
FIG. 24 is a schematic view illustrating the timing of voltage application when erasing of data is carried out in the nonvolatile memory of the semiconductor device according to Embodiment 5 of the present invention.

As illustrated in FIG. 24, application of a voltage to the drain of the MISFETs Qw1,Qw2 may be started before application of a voltage to the p well 4 is started. The voltage of the drain is adjusted to 4V or 5V prior to an increase of it to 9V. During this period, application of a voltage to the p well 4 may be started. At this time, only a timing of voltage application is different and a change in the voltage of the p well 4 must be similar to that in the voltage of the drain of the MISFETs Qw1,Qw2. This makes it possible to suppress the potential difference V1 between them so as not to exceed the junction breakdown voltage, that is, about 7V. When the drain voltage of the MISFETs Qw1,Qw2 and the voltage of the p well 4 are reduced to 0V, a reduction in the voltage of the p well 4 may be followed by a reduction in the drain voltage of the MISFETs Qw1,Qw2 and a voltage change at this time may be caused in the reverse order from the procedure for voltage increase.

Similar advantages to those of Embodiment 1 are also available in the above-described Embodiment 5.

The inventions made by the present inventors were described specifically based on some embodiments. It should however be borne in mind that the invention is not limited to or by them but can be modified to an extent not departing from its scope.

For example, in Embodiment 1, the voltage of the source and drain of the data reading MISFETs Qr1,Qr2 may be adjusted to 0V when writing of data is carried out. The voltage of the source and drain of the data writing and erasing MISFETs Qw1,Qw2 may be adjusted to 0V when reading is carried out. In a semiconductor device including a MISFET having a breakdown voltage as high as about 20V or greater, as an LCD driver, it is also possible to apply 0V to the n well 5, 0V to the p type semiconductor region 15B, and −18V to the p type semiconductor region 15A while setting the source and drain of the data writing and erasing MISFETs Qw1,Qw2 and data reading MISFETs Qr1,Qr2 at 0V or open potential.

The semiconductor device according to the present invention can be applied to, for example, a semiconductor device having a nonvolatile memory.

What is claimed is:

1. A semiconductor device equipped with a memory cell having a data writing element and a capacitive element, comprising:
   a first well of a second conductivity type formed in a semiconductor substrate of the second conductivity type;
   a second well of the second conductivity type formed in the semiconductor substrate; and
   a first conductive film extending over the first well and the second well via a first insulating film;
   wherein a semiconductor isolation layer of a first conductivity type is formed in the semiconductor substrate,
   wherein the first and second wells are formed in the semiconductor isolation layer and are separated from each other,
   wherein the data writing element is arranged in the first well,
   wherein the capacitive element is arranged in the second well,
   wherein the data writing element includes the first insulating film, the first conductive film and a first impurity region of the first conductivity type formed in the first well,
   wherein the capacitive element includes the first insulating film, the first conductive film and a second impurity region of the second conductivity type formed in the second well,
   wherein the planar size of the first conductive film of the capacitive element is larger than the planar size of the first conductive film of the data writing element,
   wherein the first conductive film is adapted to be used as a charging storage film of the memory cell, and
   wherein the second impurity region is adapted to be used as a control gate of the memory cell.

2. A semiconductor device according to claim 1, wherein the memory cell is adapted to use Fowler-Nordheim tunneling for a writing operation or an erasing operation of the memory cell.

3. A semiconductor device according to claim 1, wherein when a writing operation of the memory cell is carried out, hot electrons are injected from a channel of the data writing element to the first conductive film, and
wherein, when an erasing operation of the memory cell is carried out, the injected electrons are emitted from the first conductive film to the first well by Fowler-Nordheim tunneling.

4. A semiconductor device according to claim 1, wherein information on voltage control of an LCD driver is recorded in the memory cell.

5. A semiconductor device according to claim 1, wherein information on relief of a RAM is recorded in the memory cell.

6. A semiconductor device according to claim 1, wherein a third well of the first conductivity type is formed in the semiconductor isolation layer and is formed between the first well and the second well.

7. A semiconductor device according to claim 1, wherein the first conductivity type is n-type, and
wherein the second conductivity type is p-type.

8. A semiconductor device according to claim 1, wherein the first conductive film is formed of a polysilicon film.

9. A semiconductor device according to claim 1, wherein the memory cell is an EEPROM (Electrically Erasable and Programmable Read Only Memory).

10. A semiconductor device equipped with a memory cell having a data writing element, a capacitive element and a data reading element, comprising:
    a first well of a second conductivity type formed in a semiconductor substrate of the second conductivity type;
    a second well of the second conductivity type formed in the semiconductor substrate; and
    a first conductive film extending over the first well and the second well via a first insulating film;
    wherein a semiconductor isolation layer of a first conductivity type is formed in the semiconductor substrate, wherein the first and second wells are formed in the semiconductor isolation layer and are separated from each other, wherein the data writing element and the data reading element are arranged in the first well, wherein the capacitive element is arranged in the second well, wherein the data writing element includes the first insulating film, the first conductive film and a first impurity region of the first conductivity type formed in the first well, wherein the capacitive element includes the first insulating film, the first conductive film and a second impurity region of the second conductivity type formed in the second well, wherein the data reading element includes the first insulating film, the first conductive film and a third impurity region of the first conductivity type formed in the first well, wherein the planar size of the first conductive film of the capacitive element is larger than the planar sizes of the first conductive films of the data writing element and the data reading element, wherein the first conductive film is adapted to be used as a charging storage film of the memory cell, and wherein the second impurity region is used as a control gate of the memory cell.

11. A semiconductor device according to claim 10, wherein the memory cell is adapted to use Fowler-Nordheim tunneling for a writing operation or an erasing operation of the memory cell.

12. A semiconductor device according to claim 10, wherein, when a writing operation of the memory cell is carried out, hot electrons are injected from a channel of the data writing element to the first conductive film, and wherein, when an erasing operation of the memory cell is carried out, the injected electrons are emitted from the first conductive film to the first well by Fowler-Nordheim tunneling.

13. A semiconductor device according to claim 10, wherein information on voltage control of an LCD driver is recorded in the memory cell.

14. A semiconductor device according to claim 10, wherein information on relief of a RAM is recorded in the memory cell.

15. A semiconductor device according to claim 10, wherein a third well of the first conductivity type is formed in the semiconductor isolation layer and is formed between the first well and the second well.

16. A semiconductor device according to claim 10, wherein the first conductivity type is n-type, and wherein the second conductivity type is p-type.

17. A semiconductor device according to claim 10, wherein the first conductive film is formed of a polysilicon film.

18. A semiconductor device according to claim 10, wherein the memory cell is an EEPROM (Electrically Erasable and Programmable Read Only Memory).

19. A method of manufacturing a semiconductor device equipped with a memory cell having a data writing element and a capacitive element, comprising the steps of:

(a) forming a semiconductor isolation layer of a first conductivity type in a semiconductor substrate of a second conductivity type;

(b) forming a first well of the second conductivity type in the semiconductor isolation layer;

(c) forming a second well of the second conductivity type in the semiconductor isolation layer;

(d) forming first insulating films over the first well and the second well, respectively;

(e) forming a first conductive film over the first insulating films such that the first conductive film is extending over the first well and the second well;

(f) forming a first impurity region of the first conductivity type in the first well; and (g) forming a second impurity region of the second conductivity type in the second well;

wherein the data writing element is arranged in the first well and includes the first insulating film, the first conductive film and the first impurity region, wherein the capacitive element is arranged in the second well and includes the first insulating film, the first conductive film and the second impurity region, wherein the planar size of the first conductive film of the capacitive element is larger than the planar size of the first conductive film of the data writing element, wherein the first conductive film is adapted to be used as a charging storage film of the memory cell, and wherein the second impurity region is adapted to be used as a control gate of the memory cell.

* * * * *